(12) United States Patent
Crane et al.

(10) Patent No.: US 7,109,061 B2
(45) Date of Patent: Sep. 19, 2006

(54) WAFER APPLIED FLUXING AND UNDERFILL MATERIAL, AND LAYERED ELECTRONIC ASSEMBLIES MANUFACTURED THEREWITH

(75) Inventors: Lawrence N. Crane, Brookfield, CT (US); Mark M. Konarski, Old Saybrook, CT (US); Erin K. Yaeger, Coventry, CT (US); Afranio Torres-Filho, Enfield, CT (US); J. Paul Krug, Middletown, CT (US); Rebecca Tishkoff, Hamden, CT (US)

(73) Assignee: Henkel Corporation, Rocky Hill, CT (US)

( * ) Notice: Subject to any disclaimer, the term of this patent is extended or adjusted under 35 U.S.C. 154(b) by 657 days.

(21) Appl. No.: 09/985,728

(22) Filed: Nov. 6, 2001

(65) Prior Publication Data
US 2002/0089067 A1    Jul. 11, 2002

Related U.S. Application Data

(60) Provisional application No. 60/248,419, filed on Nov. 14, 2000.

(51) Int. Cl.
*H01L 21/48* (2006.01)
*H01L 23/48* (2006.01)

(52) U.S. Cl. .................. 438/118; 438/127; 257/783; 257/787

(58) Field of Classification Search .......... 257/737, 257/738, 778–780, 781–783, 787–789; 438/108, 438/109, 118, 127
See application file for complete search history.

(56) References Cited

U.S. PATENT DOCUMENTS 5,439,162 A * 8/1995 George et al. ......... 228/180.22
5,512,613 A   4/1996 Afzali-Ardakani et al. . 523/443
5,560,934 A  10/1996 Afzali-Ardakani et al. . 424/497
5,716,663 A   2/1998 Capote et al. ................. 427/96
5,760,337 A   6/1998 Iyer et al. ................... 174/52.2
5,814,401 A   9/1998 Gamota et al. ............. 428/343

(Continued)

FOREIGN PATENT DOCUMENTS

JP          93226416        9/1993

(Continued)

OTHER PUBLICATIONS

Rimdusit et al., "Development of new class of electronic packaging materials based on ternary systems of benzoxazine, epoxy, and phenolic resins" Polymer, Elsevier Science Publishers B.V., GB, vol. 41, No. 22, Oct. 2000, pp. 7941-7949.

(Continued)

*Primary Examiner*—Alonzo Chambliss
(74) *Attorney, Agent, or Firm*—The Webb Law Firm

(57) ABSTRACT

A flip-chip type integrated circuit chip including a chip die having electrical contacts arranged in a predetermined pattern and capable of providing electrical interconnection with a carrier substrate is provided. The chip die includes a fluxing agent disposed on a surface of the electrical contacts, and a curable thermosetting underfill composition distinct from the fluxing agent and disposed in a flowable form over the chip die. Upon mating of the chip die with the substrate and heating, the electrical contacts flow and the thermosetting underfill composition cures, thus adhering the chip die to the substrate, forming a circuit assembly.

27 Claims, 10 Drawing Sheets

U.S. PATENT DOCUMENTS

| | | | |
|---|---|---|---|
| 5,872,158 A | 2/1999 | Kuczynski | 522/182 |
| 5,932,682 A | 8/1999 | Buchwalter et al. | 528/94 |
| 5,948,533 A | 9/1999 | Gallagher et al. | 428/418 |
| 5,948,922 A | 9/1999 | Ober et al. | 549/547 |
| 5,973,033 A | 10/1999 | Ober et al. | 523/443 |
| 5,985,043 A | 11/1999 | Zhou et al. | 148/24 |
| 5,985,456 A | 11/1999 | Zhou et al. | 428/414 |
| 6,017,634 A | 1/2000 | Capote et al. | 428/414 |
| 6,121,689 A | 9/2000 | Capote et al. | 257/783 |
| 6,132,646 A | 10/2000 | Zhou et al. | 252/512 |
| 6,168,972 B1* | 1/2001 | Wang et al. | 438/108 |
| 6,194,788 B1 | 2/2001 | Gilleo et al. | 257/789 |
| 6,208,525 B1* | 3/2001 | Imasu et al. | 361/783 |
| 6,228,678 B1 | 5/2001 | Gilleo et al. | 438/108 |
| 6,265,776 B1 | 7/2001 | Gilleo | 257/738 |
| 6,297,560 B1 | 10/2001 | Capote et al. | 257/778 |
| 6,323,062 B1 | 11/2001 | Gilleo et al. | 438/114 |
| 6,335,571 B1 | 1/2002 | Capote et al. | 257/787 |
| 6,399,426 B1 | 6/2002 | Capote et al. | 438/127 |
| 6,417,573 B1* | 7/2002 | Pendse | 257/778 |

FOREIGN PATENT DOCUMENTS

| | | |
|---|---|---|
| JP | 08088464 | 8/1996 |
| WO | 98/31738 | 7/1998 |
| WO | 9904430 | 1/1999 |
| WO | 9956312 | 11/1999 |
| WO | 00/56799 | 9/2000 |
| WO | 00/79582 | 12/2000 |

OTHER PUBLICATIONS

Fan et al., "Adhesion comparison between thermosetting and thermoplastic resin systems based on poly(bisphenol A-co-epichlorohydrin) chemistry", 4th International Conference on Adhesive Joining and Coating Technology in Electronics Manufacturing, pp. 243-247.

Johnson et al., "Reflow-curable polymer fluxes for flip chip encapsulation", Multichip Modules and High Density Packaging, 1998, pp. 41-46.

Wang et al. "Sytheses and Characterizations of Thermally Reworkable Epoxy Resins II", Journal of Polymer Science, Part A (Polymer Chemistry) Oct. 15, 2000, Wiley, USA, vol. 38, No. 20, pp. 3771-3782.

* cited by examiner

WAFER APPLIED FLUXING AND UNDERFILL MATERIAL, AND LAYERED ELECTRONIC ASSEMBLIES MANUFACTURED THEREWITH

CROSS-REFERENCE TO RELATED APPLICATION

The present application claims priority to U.S. Ser. No. 60/248,419 filed Nov. 14, 2000.

BACKGROUND OF THE INVENTION

1. Field of the Invention

The present invention relates to assemblies for connecting circuitry. More particularly, the invention relates to mounting assemblies and methods for providing electrical connection between electronic circuitry.

2. Brief Description of Related Technology

In recent years, the popularity of small-sized electronic appliances, such as camera-integrated video tape recorders and portable telephone sets, has made size reduction of large-scale integration desirable. As a result, chip size or chip scale packages are being used to reduce the size of packages substantially to that of bare chips. Such chip scale packages include a semiconductor chip mounted on a carrier substrate, which improves the characteristics of the electronic device while retaining many of the operating features, thus serving to protect semiconductor bare chips and facilitate testing thereof.

Upside down integrated circuits, commonly referred to as "flip-chips", are now gaining popularity as well. Flip-chips are manufactured using solder bump technology, in which solder bumps are deposited on solder-wettable metal terminations on a die or chip and a matching pattern of solder-wettable terminations on the substrate. With flip-chips, the solder bumps are placed on the integrated circuit terminals while the chip is in wafer form, and then, after singulation, a chip is flipped and aligned to the circuit board substrate. A fluxing agent is applied and the solder bumps are re-flowed by heating to establish bonding between the chip and the substrate, with all the joints being made simultaneously by melting the solder.

When the resulting circuit board assembly is exposed to thermal cycling, the reliability of the solder connection between the circuit board and the chip often becomes suspect. Commonly, after a chip is mounted on a circuit board, the space between the chip and the circuit board is filled with a sealing resin (often referred to as underfill sealing) in order to reinforce against stresses caused by thermal cycling. Such underfill encapsulation has gained considerable acceptance in the electronics industry, with epoxy-based resin materials being most commonly used in such applications. Moreover, the expansion coefficients of the underfill sealing can be adjusted, for example, by the addition of low thermal-expansion fillers, such as glass or ceramics, thus reducing the level of thermal stress that develops between the substrate and the underfill sealing. The underfill sealing thus provides structural reinforcement, which delocalizes the thermal expansion stress, thereby improving heat shock properties and enhancing the reliability of the structure.

Also, the underfill material helps adhere the chip to the substrate. As such, the underfill material should exhibit high cohesive strength to the die and the circuit board surface, and retain significant strength within the environment encountered by the electronic device, for example, during heat-up and cool-down cycles associated with on/off powering of the electronics, as well as climatic changes in temperature and humidity.

Application of underfill sealing typically involves dispensing the underfill material onto one or more edges of the flip-chip assembly after it has been assembled and the solder bumps affixed to the substrate. Capillary action draws the underfill material through the gap between the chip and the substrate. Such underfill techniques are time consuming, and complete filling of the underfill sealing between the chip and the substrate can be difficult to achieve, thus reducing the protection level afforded through the underfill sealing.

In an attempt to overcome these issues and to eliminate processing steps, underfill sealants incorporating fluxing agents for bonding of the solder bumps have been proposed. For example, U.S. Pat. Nos. 5,985,043 and 5,985,486 disclose polymerizable fluxing agents, which act as an adhesive to bond the chip to the substrate. Such polymerizable fluxing agents are based on polycarboxylic acids having olefinic linkages, compositions of that are curable upon exposure to heat. The thinking here is that the underfill sealant incorporating such polymerizable fluxing agents can be applied to the chip during the wafer stage of chip manufacture, often referred to as wafer-applied fluxing underfill, in which a plurality of chips are manufactured in one piece and later cut into individual chips. By pre-applying onto the wafer the fluxing agent/underfill sealant combination, the chip should only need to be placed on the substrate, with solder re-flow and underfill curing occurring to affix the chip thereto. In practice, however, including the fluxing agent and underfill sealant in a single composition tends to compromise adhesion and mechanical strength of the underfill sealant.

Further, in some applications, the desirability of component removal may be of a concern, for example, when chip failure occurs. To avoid destroying or scrapping the entire assembly, it has been proposed to include reworkable adhesive materials in the assembly process. Such reworkable adhesive materials may be used as the underfill encapsulant adhesive, thereby providing reworkability to enable removal and replacement of one or more defective die. Such reworkable underfill materials typically involve thermally cleavable epoxy-based polymers, which will decompose rapidly when exposed to a high enough temperature. For example, U.S. Pat. No. 5,948,922 (Ober) and U.S. Pat. No. 5,973,033 (Ober), each refer to a certain class of compounds and compositions based on such compounds which, when cured, provide decomposable compositions capable of being reworked.

U.S. Pat. No. 5,512,613 (Afzali-Ardakani), U.S. Pat. No. 5,560,934 (Afzali-Ardakani) and U.S. Pat. No. 5,932,682 (Buchwalter), each refer to a reworkable thermoset composition based on a diepoxide component in which the organic linking moiety connecting the two epoxy groups of the diepoxide includes an acid cleavable acyclic acetal group. With such acid cleavable acyclic acetal groups forming the basis of the reworkable composition, a cured thermoset need only be introduced to an acidic environment in order to achieve softening and a loss of much of its adhesiveness.

U.S. Pat. No. 5,872,158 (Kuczynski) refers to thermosetting compositions capable of curing upon exposure to actinic radiation, which are based on acetal diacrylates, and reaction products of which are reported to be soluble in dilute acid.

U.S. Pat. No. 5,760,337 (Iyer) refers to thermally reworkable crosslinked resins to fill the gap created between a semiconductor device and a substrate to which it is attached.

These resins are produced by reacting a dienophile (with a functionality greater than 1) with a 2,5-dialkyl substituted furan-containing polymer.

International Patent Publication No. PCT/US98/00858 refers to a thermosetting resin composition capable of sealing underfilling between a semiconductor device including a semiconductor chip mounted on a carrier substrate and a circuit board to which said semiconductor device is electrically connected. The composition includes about 100 parts by weight of an epoxy resin, about 3 to about 60 parts by weight of a curing agent, and about 1 to about 90 parts by weight of a plasticizer. Here, the area around the cured thermoset is to be heated at a temperature of about 190° C. to about 260° C. for a period of time ranging from about 10 seconds to about 1 minute in order to achieve softening and a loss of much of its adhesiveness.

The additional chemistry built into such reworkable polymers to provide the ability to controllably degrade under appropriate conditions, however, oftentimes detracts from the overall effectiveness of the underfill sealing in terms of strength, adhesion, and moisture resistance.

U.S. Pat. No. 6,121,689 discloses a semiconductor flip-chip package, which includes a polymerizable fluxing agent. FIGS. 1 and 2 herein depict flip-chip structures as set forth in the '689 patent. As is apparent, the flip-chip structure of FIG. 1 includes a chip 10 having solder bumps 14 pre-assembled on contact pads 24 on bottom surface 16 of chip 10 for electrical connection with solder pads 12 of a substrate 20 through the use of an encapsulant 22. In further embodiments, a fluxing adhesive may be used to adhere the chip 10 to the substrate 20. Moreover, as shown in FIG. 2, the structure may also include a multi-layer encapsulant material 36, including attachment and stress distribution layers 38 and 40, and thermoplastic reworkability layer 42. This thermoplastic reworkability layer is generally a meltable polymer such as a polyimide-siloxane copolymer. As shown in FIG. 2, flux adhesive 34 may be provided between the chip 10 and the substrate 20 for attachment of the chip 10 to the substrate 20. Adhesion and mechanical strength of the underfill sealant may be compromised due to the incorporation of the fluxing agent and the adhesive in a single composition. Also, when an integrated circuit chip includes an encapsulant having a fluxing adhesive incorporated therein, the fluxing adhesive may adversely affect the encapsulant material, thereby reducing the shelf stability or pot-life. Also, the use of a thermoplastic material as the reworkability layer provides the assembly with limited rework properties.

Notwithstanding the state of the art, it would be desirable for an integrated circuit chip having an underfill sealant material which provides excellent adherence and thermal shock properties while allowing the substrate with which it is to be used to be readily processed without compromising the physical properties of the materials or the assembly.

SUMMARY OF THE INVENTION

The present invention is directed to an upside-down flip-chip type integrated circuit chip, which is electrically interconnectable with a carrier substrate, such as a circuit board substrate. The integrated circuit chip includes a chip die having electrical contacts which are flowable upon heating, such as solder bumps, arranged in a predetermined pattern and capable of providing electrical engagement and interconnection with electronic circuitry on a surface of the carrier substrate. A fluxing agent is disposed on a surface of the electrical contacts at a location capable of providing effective fluxing activity to the electrical contacts of the chip die and the electronic circuitry of the carrier substrate when the chip die is mated with the carrier substrate. Also, a curable thermosetting underfill composition is dispensed in a flowable form over the chip die about the electrical contacts and distinct from the fluxing agent. Upon mating of the chip die with the carrier substrate to form a mated assembly and upon heating the mated assembly to a temperature sufficient to render the electrical contacts flowable, the electrical contacts flow to provide electrical interconnection between the chip die and the carrier substrate, and the thermosetting underfill composition cures, thereby adhering the chip die to the carrier substrate. As such, a circuit assembly is provided, with the thermosetting underfill composition when cured providing a dielectric layer between the chip die and the carrier substrate.

Desirably, the fluxing agent is disposed over substantially the entire surface of the electrical contacts; with at least a portion of the electrical contacts being exposed from the thermosetting underfill composition. The fluxing agent is desirably an organic acid, and may include an epoxy compound capable of drying to form a film of the fluxing agent on the electrical contacts.

The thermosetting underfill composition may include a curable component, a curing agent for promoting cure of the curable component and, optionally, an inorganic filler component. Desirably, the curable component is an epoxy resin. In one embodiment, the thermosetting underfill composition, when cured, may be controllably degradable when exposed to appropriate conditions. For example, the thermosetting underfill composition may include a curable compound having at least one thermally cleavable linkage.

The chip die may be provided as a chip scale package or a packaged integrated circuit. As such, the electrical contacts are arranged on the packaged integrated circuit for providing electrical interconnection with the electronic circuitry of the carrier substrate.

The present invention is also directed to a method for assembling an integrated circuit assembly by mating such an integrated circuit chip with a carrier substrate to form a mated assembly. Such a mated assembly is then exposed to temperature conditions sufficient to promote electrical interconnection between the integrated circuit chip and the carrier substrate and to cure the thermosetting underfill composition, thereby adhering the integrated circuit chip to the carrier substrate.

As such, the present invention also provides an integrated circuit chip assembly which includes a carrier substrate and a chip die electrically interconnected with the carrier substrate through the use of solder having had a fluxing agent disposed on at least a portion thereof. The chip die is adhered to the carrier substrate through a cured thermoset underfill compound which is substantially free of residue from the fluxing agent, since the fluxing agent had been distinct from a curable thermosetting underfill composition from which the cured thermoset underfill compound is formed.

In yet a further embodiment, the present invention is directed to an integrated circuit chip which is electrically interconnectable with a carrier substrate, including a chip die having electrical contacts which are flowable upon heating arranged in a predetermined pattern and capable of providing electrical engagement and interconnection with electronic circuitry on a surface of the carrier substrate, and a fluxing agent disposed on a surface of the electrical contacts at a location capable of providing effective fluxing activity to the electrical contacts of the chip die and the electronic circuitry of the carrier substrate when the chip die is mated with the carrier substrate. The integrated circuit chip further includes a first curable thermosetting underfill composition dispensed in a flowable form over the chip die about the electrical contacts and distinct from the fluxing agent, and a second thermosetting underfill composition dispensed in a flowable form over the first thermosetting underfill composition about the electrical contacts and distinct from the first thermosetting underfill composition and the fluxing agent. Upon mating of the chip die with the carrier substrate to form a mated assembly and upon heating the mated assembly to a temperature sufficient to render the electrical contacts flowable, the electrical contacts flow to provide electrical interconnection between the chip die and the carrier substrate, and the first and second thermosetting underfill compositions are cured, thereby adhering the chip die to the carrier substrate. As such, an integrated circuit chip is provided, with the first thermosetting underfill composition when cured providing a first dielectric layer in contact with the chip die and having a coefficient of thermal expansion compatible with the chip die, and the second thermosetting underfill composition when cured providing a second dielectric layer in contact with the first dielectric layer and the carrier substrate and having a coefficient of thermal expansion compatible with the carrier substrate and the first dielectric layer.

The first and second thermosetting compositions may each individually include a curable component such as an epoxy resin, a curing agent for promoting cure of the curable component and, optionally, an inorganic filler component. Desirably, at least one of the first or the second thermosetting underfill compositions, when cured, is controllably degradable when exposed to appropriate conditions, such as by including at least one thermally cleavable linkage.

A method for assembling such an integrated circuit assembly is also provided through the present invention by mating such an integrated circuit chip with a carrier substrate to form a mated assembly, and exposing the mated assembly to temperature conditions sufficient to promote electrical interconnection between the integrated circuit chip and the carrier substrate and to cure both the first and second thermosetting underfill compositions, thereby adhering the integrated circuit chip to the carrier substrate.

An integrated circuit assembly thus prepared is also provided, which includes a carrier substrate and a chip die electrically interconnected with the carrier substrate through the use of solder having had disposed on at least a portion thereof a fluxing agent, with the chip die adhered to the carrier substrate through a cured thermoset composite which is substantially free of residue from the fluxing agent. The cured thermoset composite includes a first dielectric layer having a coefficient of thermal expansion compatible with the chip die, and a second dielectric layer having a coefficient of thermal expansion compatible with the circuit board substrate. Prior to assembly, the fluxing agent was directly provided on a surface of the solder and distinct from the curable thermosetting compositions from which the dielectric layers are formed.

The present invention is also directed to a method for assembling an integrated circuit chip. Such a method involves providing a chip die, which includes flowable electrical contacts, arranged in a predetermined pattern on a surface. A fluxing agent is applied over at least a portion of the electrical contacts and desirably dried. A curable thermosetting underfill composition is then dispensed in a flowable form on the chip die around the electrical contacts, with the thermosetting underfill composition being distinct from the fluxing agent. The flowability of this thermosetting underfill composition may thereafter be reduced, such as by drying. Optionally, a second thermosetting underfill composition may be dispensed in a flowable form on the thermosetting underfill composition around the electrical contacts, with the second thermosetting underfill composition being distinct from the fluxing agent and the first thermosetting underfill composition. Similarly, the flowability of this second thermosetting underfill composition may thereafter be reduced, as with the first thermosetting underfill composition. The fluxing agent and the first and second underfill compositions may be applied and dispensed, for example, by screen printing, stencil printing, jet printing, pad printing, or offset printing.

DETAILED DESCRIPTION OF THE INVENTION

Figure 3:
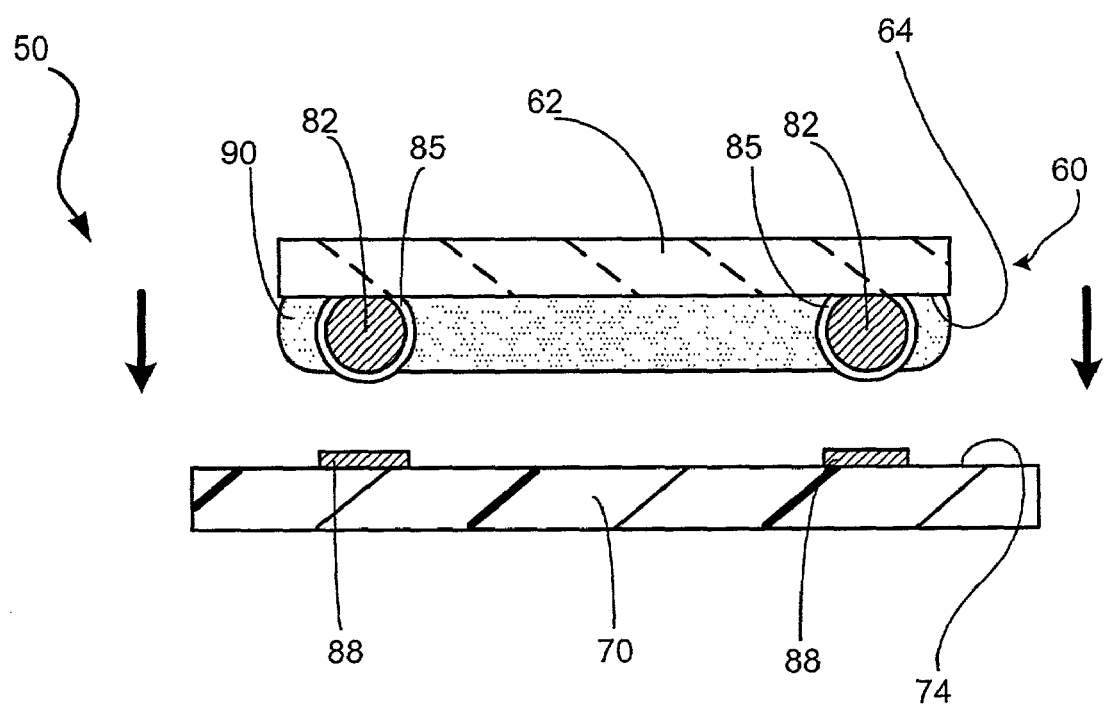
FIG. 3 is a schematic representation of a circuit assembly according to the present invention showing a flip-chip circuit chip and a substrate prior to assembly.
Figure 4:
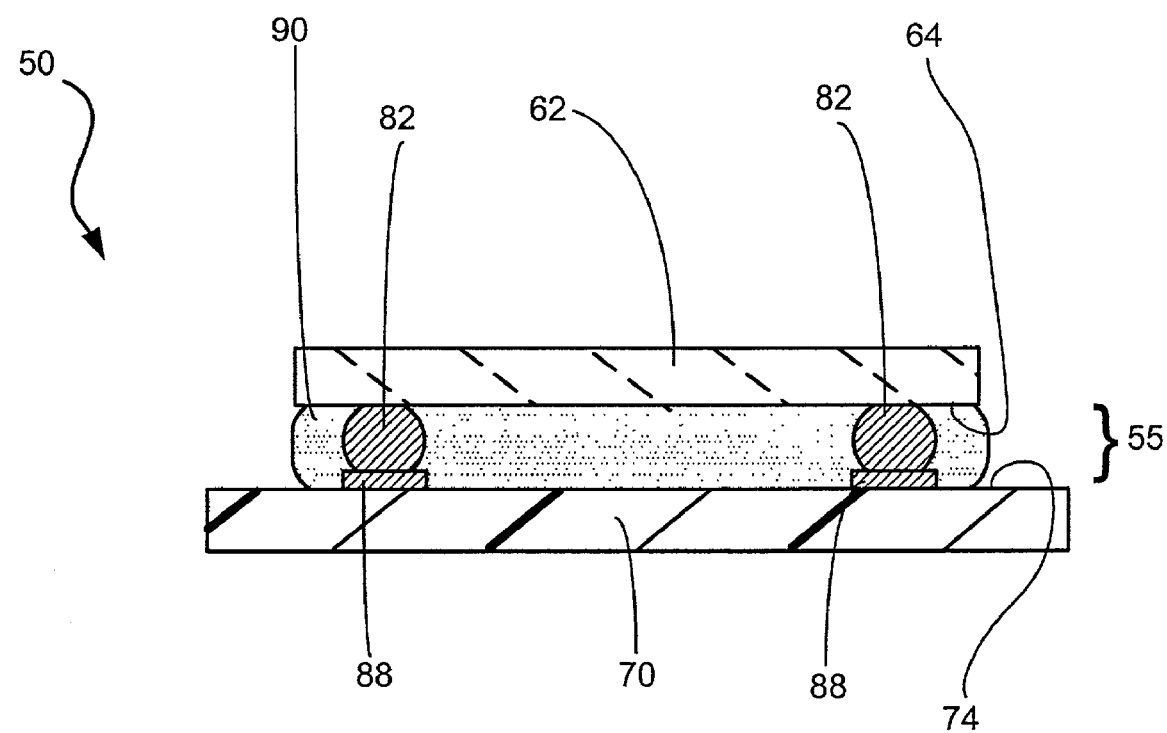
FIG. 4 is a schematic representation of the circuit assembly of FIG. 2 after assembly.

Referring to the drawings in which like reference characters refer to like parts throughout the several views thereof, a circuit assembly 50 is depicted in FIGS. 3 and 4, including an upside down flip-chip type semiconductor chip in the form of integrated circuit chip 60, and a carrier substrate such as circuit board substrate 70. Integrated circuit chip 60 includes a chip die 62. Chip die 62 may be constructed of any material known in the art. For example, chip die 62 may be constructed of silicon, germanium, or the like. Chip die 62 may also be coated with a material, which is capable of passivating environmental corrosion, such as a polyimide-, poly-benzocyclobutane-, or silicone nitride-based material.

Substrate 70 may also be constructed of any material known in the art. For example, substrate 70 may be constructed from ceramic substrates including $Al_2O_3$, silicon nitride $(SiN_3)$, and mullite $(Al_2O_3—SiO_2)$; substrates or tapes of heat-resistant resins, such as polyimides; substrates of glass-reinforced epoxy; substrates of acrylonitrile-butadiene-styrene (ABS); and phenolic substrates, and the like.

Chip die 62 includes circuitry on a chip surface 64 thereof, including a plurality of electrical contact pads, such as metallized contact pads (not shown) which are arranged in a predetermined pattern, as is known in the art. These electrical contact pads are arranged to receive a plurality of corresponding electrical contacts in the form of solder bumps 82 connected to the contact pads of the chip die 62. Further, substrate 70 includes electronic circuitry on a substrate surface 74 thereof, including a plurality of electrical contact pads, such as solder pads 88. Each of solder pads 88 and solder bumps 82 are metallized so as to become solderable and electrically conductive, thus providing electrical interconnection between the circuitry on chip die 62 and the circuitry on substrate 70 when integrated circuit chip 60 is mounted on substrate 70, as will be described in more detail herein. While the present FIGS. depict two solder bumps 82 on chip die 62 and two corresponding solder pads 88 on substrate 70 for purposes of demonstrating the present invention, it should be understood that the number of solder bumps 82 and solder pads 88 may be varied according to the particular desired use and the particular configuration of the circuit chip, and the specific configuration depicted herein should not be considered as limiting of the present invention.

Solder bumps 82 may be applied to chip die 62 in any manner as is known in the art. Solder bumps 82 may incorporate any known solder alloy, provided that such solder is flowable upon heating. Selection of the solder alloy for solder bumps 82 depends, in part, on the particular melting point and on the material used for the chip and substrate. For example, solders having a high melting point, such as high lead or lead-free solders, are useful with alumina ceramic substrates. Lower melting solder alloys, such as eutectic tin/lead solder or lead/indium solder, are particularly useful when polymeric circuit boards are used, due to their lower melting point. Of course, the specific solder useful for solder bumps 82 will also depend upon the specific compositions used in the underfill components of the present invention, as will be discussed in more detail.

Each of solder bumps 82 includes a fluxing agent 85 disposed as a layer or film extending over the surface of each solder bump 82. Fluxing agent 85 provides fluxing action for the soldering operation. Fluxing agents which are particularly useful in the present invention include carboxylic acids of the general formula:

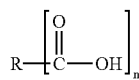

where R is hydrogen, alkyl, aryl, or a polymer, and n is an integer from 1–50. Non-limiting examples of fluxing agents useful in the present invention include materials selected from abietic acid, adipic acid, ascorbic acid, acrylic acid, citric acid, 2-furanoic acid, malic acid, salicylic acid, glutaric acid, pimelic acid, polyacrylic acids, and other acid functionalities, such as phenol and derivatives thereof, and sulfonic acids, such as toluene sulfonic acids.

A particularly desirable one is DIACID 1550 which is a liquid monocyclic twenty-one carbon dicarboxylic acid derived from tall oil fatty acids; specifically it is 1-n-heptyl carboxylic acid, 2-carboxylic acid, 4-n-hexyl-cyclohexenes, available from Westvaco Oleo Chemicals.

Other organic acids useful as fluxing agents are those having the general formula:

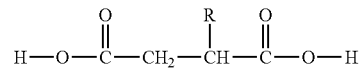

where R is an electron-withdrawing group, such as fluorine, chlorine, bromine, iodine, sulfur, nitrile, hydroxyl, or benzyl.

It is also contemplated through the present invention that fluxing agent 85 may be a latent organic acid, such as a thermally-activatable blocked organic acid, which is capable of providing fluxing activity when the temperature is increased above a temperature which causes release of a constituent blocking the acid group of the composition.

Fluxing agent 85 may be provided, for example, in the form of a liquid composition, which is coated onto solder bumps 82. Such a liquid composition preferably includes a fluxing agent dissolved or dispersed in a suitable solvent. During application of fluxing agent 85 to solder bumps 82, the solvent is driven off of the composition, resulting in fluxing agent 85 present as a coated film layer. Such coated film layer desirably has a film thickness from about 0.25 to about 2 mil, more desirably from about 0.5 to about 1 mil.

Fluxing agent 85 may further include an epoxy compound. Such an epoxy compound acts as a carrier for the fluxing agent, in that the fluxing agent can be disposed on the surface of solder bumps 82 and dried, with the epoxy compound providing a vehicle for the fluxing agent to remain as a film on the surface of solder bumps 82. Moreover, such an epoxy compound may be capable of reacting with the thermosetting underfill compositions provided in circuit assembly 50.

Fluxing agent 85 is disposed on a surface of solder bumps 82 at a location capable of providing effective fluxing activity for soldering solder bumps 82 with solder pads 88 when chip die 62 is mated with substrate 70. As such, fluxing agent 85 may be disposed as a film, covering the entire surface of solder bumps 82. Alternatively, fluxing agent 85 may be disposed over only a small portion of solder bumps 82, representing the portion of solder bumps 82 to be mated and soldered with solder pads 88.

Fluxing agent 85 may be coated on solder bumps 82 in any manner capable of providing a substantially consistent coating over solder bumps 82, thereby insuring adequate fluxing action during soldering. For example, fluxing agent 85 may be stencil printed or screen printed onto solder bumps 82. Alternatively, fluxing agent 85 may be printed onto solder bumps 82 through an offset gravure printing method, such as pad printing. In such a method, a gravure or cliché is patterned with the area to be printed, and ink is transferred from the cliché to the part to be printed using a silicon pad. Extrusion coating processes and jet printing processes may also be used to coat fluxing agent 85 onto solder bumps 82.

In flip-chip mounting arrangements, mounting of the chip die to the substrate surface typically results in a gap, such as gap 55, formed between the chip die 62 and the substrate 70, around solder bumps 82 between the chip surface 64 of the integrated circuit chip 60 and the substrate surface 74 of substrate 70. Gap 55 is encapsulated with an underfill component 90, providing an underfill material between chip die 62 and substrate 70, and for adhering integrated circuit chip 60 to substrate 70. Desirably, chip die 62, having separate discrete solder bumps 82 pre-assembled thereon, is pre-coated with fluxing agent 85 over solder bumps 82 and with underfill component 90 prior to assembly of chip die 62 with substrate 70 to alleviate the underfill problems of the prior art processes, and to overcome the performance limitations of substrates which are pre-coated with a homogeneous combination of adhesive material, fluxing agent, and curing agent. Thus, the present invention provides, in one embodiment, an integrated circuit chip having electrical contacts pre-coated with a fluxing agent thereon, and including a pre-coated underfill component.

More particularly, in prior art processes for flip-chip mounting arrangements, such as U.S. Pat. No. 6,121,689 discussed above, the chip die commonly includes a fluxing adhesive material coated on the surface to act as an underfill material, with holes drilled through the fluxing adhesive material and filled with an electrically conductive material, such as solder, for providing electrical interconnection with a substrate when the chip die is mated with the substrate and the solder is reflowed. In such an arrangement, the fluxing agent is disposed throughout the adhesive underfill material, allowing for fluxing during heating of the assembly for solder reflow. Fluxing agents, however, are not traditionally compatible with materials particularly useful as underfill materials, such as epoxy thermosetting resins and/or curing agents used with such resins. As such, including the fluxing agent within the underfill material can adversely affect the storage stability or pot-life of the adhesive underfill material. Moreover, during heating of the assembly for fluxing activity and solder reflow, residue from the fluxing agent may be dispersed throughout the entire adhesive underfill material, since the fluxing agent is a component within the adhesive underfill material. Such residue may adversely affect the curing properties of the adhesive underfill material, which may result in insufficient curing, and improper adhesion between the chip die and the substrate.

In the present invention, the fluxing agent 85 is directly disposed only on a surface of the solder bumps 82, and the underfill component is a separate and discrete component which is distinct from the fluxing agent. Accordingly, the fluxing agent will not adversely affect the storage stability or pot-life of the underfill component, and any residue from the fluxing agent will not adversely affect the cure of the underfill component.

Underfill component 90 is in contact with chip die 62 on chip surface 64. Underfill component 90 provides circuit assembly 50, after assembly as an integrated unit, with high adhesive strength for adhering chip die 62 to substrate 70, and with low thermal expansion for increased reliability of circuit assembly 50. Underfill component 90, when cured, also provides a dielectric layer between chip die 62 and substrate 70.

As noted above, the underfill component of the present invention is a curable composition, which provides high adhesive strength and low thermal expansion. Thermosetting resin compositions are particularly useful as the curable underfill component. Such a thermosetting resin composition may broadly include (a) a curable resin component; (b) an optional inorganic filler component; and (c) a curing agent component including an anhydride component, a nitrogen-containing component, such as an amine compound, an amide compound, and/or an imidazole compound, and/or combinations thereof.

Typically, the composition includes about 10 to about 60 weight percent of the curable resin component by weight of the total composition; about 0 to about 60 weight percent of the inorganic filler component; and 0.01 to about 60 weight percent of the curing agent component, of which about 0 to about 60 weight percent thereof is comprised of an anhydride compound, 0 to about 5 weight percent thereof is comprised of an amide compound, such as a cyano-functionalized amide, like dicyandiamide, and 0 to about 2 weight percent thereof is comprised of an imidazole compound.

Of course, depending on the particular set of properties desirable for a composition destined for a specific purpose, these values may vary somewhat. Such variation may be achieved without undue experimentation by those persons skilled in the art, and accordingly are contemplated within the scope of the present invention.

The curable resin component may be selected from any known resin. Desirably, the curable resin component may be any common epoxy resin, such as a multifunctional epoxy resin.

Examples include the following multifunctional epoxy resins: bisphenol-A-type epoxy resin (such as RE-310-S from Nippon Kayaku, Japan, or EPON 1002f from Shell Chemical Co.), bisphenol-F-type epoxy resin (such as RE-404-S from Nippon Kayaku, Japan), phenol novalec-type epoxy resin, and cresol novalec-type epoxy resin (such as "ARALDITE" ECN 1871 from Ciba Specialty Chemicals, Hawthorne, N.Y.).

Other suitable epoxy resins include polyepoxy compounds based on aromatic amines and epichlorohydrin, such as N,N,N',N'-tetraglycidyl-4,4'-diaminodiphenyl methane; N-diglycidyl-4-aminophenyl glycidyl ether; and N,N,N',N'-tetraglycidyl-1,3-propylene bis-4-aminobenzoate, as well as polyglycidyl derivatives of phenolic compounds, such as those available commercially under the tradename "EPON", such as "EPON" 828, "EPON" 1001, "EPON" 1009, and "EPON" 1031 from Shell Chemical Co.; "DER" 331, "DER" 332, "DER" 334, and "DER" 542 from Dow Chemical Co.; and BREN-S from Nippon Kayaku. Other suitable epoxy resins include polyepoxides prepared from polyols and the like and polyglycidyl derivatives of phenol-formaldehyde novalecs, the latter of which are available commercially under the tradename "DEN", such as "DEN" 431, "DEN" 438, and "DEN" 439 from Dow Chemical. Cresol analogs are also available commercially under the tradename "ARALDITE", such as "ARALDITE" ECN 1235, "ARALDITE" ECN 1273, and "ARALDITE" ECN 1299 from Ciba Specialty Chemicals Corporation. SU-8 is a bisphenol-A-type epoxy novalec available from Interez, Inc. Polyglycidyl adducts of amines, aminoalcohols and polycarboxylic acids are also useful in this invention, commercially available resins of which include "GLYAMINE" 135, "GLYAMINE" 125, and "GLYAMINE" 115 from F.I.C. Corporation; "ARALDITE" MY-720, "ARALDITE" 0500, and "ARALDITE" 0510 from Ciba Specialty Chemicals and PGA-X and PGA-C from the Sherwin-Williams Co.

And, of course, combinations of the different curable resins are also desirable for use herein.

As an inorganic filler component, many materials are potentially useful. For instance, the inorganic filler component may often include reinforcing silicas, such as fused silicas, and may be untreated or treated so as to alter the chemical nature of their surface. Virtually any reinforcing fused silica may be used.

Particularly desirable ones have a low ion concentration and are relatively small in particle size (e.g., in the range of about 2–10 microns, such as on the order of about 2 microns), such as the silica commercially available from Admatechs, Japan under the trade designation SO-E5.

Other desirable materials for use as the inorganic filler component include those constructed of or containing aluminum oxide, silicon nitride, aluminum nitride, silica-coated aluminum nitride, boron nitride, and combinations thereof.

The curing agent component should include materials capable of catalyzing the polymerization of the epoxy resin component. Desirable curing agents include an anhydride component, a nitrogen-containing component, such as an amine compound, an amide compound, and an imidazole compound, and combinations thereof.

Appropriate anhydride compounds for use herein include mono- and poly-anhydrides, such as hexahydrophthalic anhydride ("HHPA") and methyl hexahydrophthalic anhydride ("MHHPA") (commercially available from Lindau Chemicals, Inc., Columbia, S.C., used individually or as a combination, which combination is available under the trade designation "LINDRIDE" 62C) and 5-(2,5-dioxotetrahydrol)-3-methyl-3-cyclohexene-1,2-dicarboxylic anhydride (commercially available from ChrisKev Co., Leewood, Kans. under the trade designation B-4400).

Of course, combinations of these anhydride compounds are also desirable for use in the compositions of the present invention.

Examples of the amine compounds include aliphatic polyamines, such as the di- or tri-aza compounds:

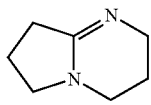

1,5-diazabicyclo[3.4.0]non-ene;

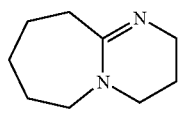

1,8-diazabicyclo[5.4.0]undec-7-ene ("DBU");

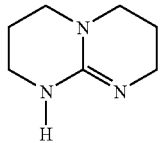

1,5,7-triazabicyclo[4.4.0]dec-5-ene;

the bicyclo mono- and di-aza compounds:

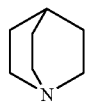

quinuclidine;

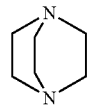

1,4-diazabicyclo[2.2.2]octane;

the alkyl polyamines:
  diethylenetriamine, triethylenetriamine, diethylaminopropylamine, isophoronediamine and menthenediamine; and the aromatic polyamines:
  m-xylenediamine, diaminodiphenylamine, and quinoxaline.

The nitrogen-containing compound portion of the salt thereof ordinarily includes di-aza compounds or tri-aza compounds.

Of course, combinations of these amine compounds are also desirable for use in the compositions of the present invention.

Aromatic polyamines and alicyclic polyamines are also desirable as curing agents, particularly 4,4'-methylenedianiline ("MDA") and 4,4'methylenebis(cyclohexylamine) ("MCA"). Of course, combinations of these amine compounds are also desirable for use in the present invention.

Examples of amide compounds include cyano-functionalized amides, such as dicyandiamide.

The imidazole compounds may be chosen from imidazole, isoimidazole, and substituted imidazoles—such as alkyl-substituted imidazoles (e.g., 2-methyl imidazole, 2-ethyl-4-methylimidazole, 2,4-dimethylimidazole, butylimidazole, 2-heptadecenyl-4-methylimidazole, 2-undecenylimidazole, 1-vinyl-2-methylimidazole, 2-undecylimidazole, 2-heptadecylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole and addition products of an imidazole and trimellitic acid and the like, generally where each alkyl substituent contains up to about 17 carbon atoms and desirably up to about 6 carbon atoms), and aryl-substituted imidazoles [e.g., phenylimidazole, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole)-benzene-1,4,2-naphthyl-4,5-diphenylimidazole, 1-benzyl-2-methylimidazole, 2-p-methoxystyrylimidazole, and the like, generally where each aryl substituent contains up to about 10 carbon atoms and desirably up to about 8 carbon atoms].

Examples of commercial imidazole compounds are available from Air Products, Allentown, Pa. under the trade designation "CUREZOL" 1B2MZ and from Synthron, Inc., Morganton, N.C. under the trade designation "ACTIRON" NXJ-60; and from Borregaard Synthesis, Newburyport, Mass. under the trade designation "CURIMID CN".

Of course, combinations of these imidazole compounds are also desirable for use in the present invention.

The curing agent component may be used in an amount of from about 2% to about 40% of the epoxy resin.

In addition, the composition may also include a flowability agent, such as a silane and/or titanate.

Appropriate silanes for use herein include octyl trimethoxy silane (commercially available from OSI Specialties Co., Danbury, Conn. under the trade designation A-137), and methacryloxy propyl trimethoxy silane (commercially available from OSI under the trade designation A-174).

Appropriate titanates for use herein include titanium IV tetrakis [2,2-bis[(2-propenyloxy)methyl]-1-butanolato-0] [bis(ditridecylphosphito-0), dihydrogen]$_2$ (commercially available from Kenrich Petrochemical Inc., Bayonne, N.J. under the trade designation KR-55).

When used, the flowability agent may be used in an amount of 0 to about 2% of the curable resin.

In addition, adhesion promoters, such as the silanes, glycidyl trimethoxysilane (commercially available from OSI under the trade designation A-187) or gamma-amino propyl triethoxysilane (commercially available from OSI under the trade designation A-1100), may be used.

Conventional additives may also be used in the bulk underfill component of the present invention to achieve certain desired physical properties of the composition, the cured reaction product, or both.

For instance, it may be desirable in certain instances (particularly where a large volume of inorganic filler component is used) to include a reactive co-monomer component for the epoxy resin component, such as a reactive diluent.

Appropriate reactive diluents for use herein may include monofunctional or certain multifunctional epoxy resins. The reactive diluent should have a viscosity which is lower than that of the epoxy resin component. Ordinarily, the reactive diluent should have a viscosity less than about 250 cps. In the event such a monofunctional epoxy resin is included as a reactive diluent, such resin should be employed in an amount of up to about 50 parts based on the total of the epoxy resin component.

The monofunctional epoxy resin should have an epoxy group with an alkyl group of about 6 to about 28 carbon atoms, examples of which include $C_{6-28}$ alkyl glycidyl ethers, $C_{6-28}$ fatty acid glycidyl esters and $C_{6-28}$ alkylphenol glycidyl ethers.

Commercially available monofunctional epoxy resin reactive diluents include those from Pacific Epoxy Polymers, Richmond, Mich., under the trade designations PEP-6770 (glycidyl ester of neodecandoic acid), PEP-6740 (phenyl glycidyl ether) and PEP-6741 (butyl glycidyl ether).

Commercially available multifunctional epoxy resin reactive diluents include those from Pacific Epoxy Polymers, under the trade designations PEP-6752 (trimethylolpropane triglycidyl ether) and PEP-6760 (diglycidyl aniline).

The thermosetting underfill composition useful in the present invention may further contain other additives, such as defoaming agents, leveling agents, dyes, and pigments. Moreover, photopolymerization initiators may also be incorporated therein, provided that such initiators do not adversely affect the properties of the composition or reaction products formed therefrom.

The thermosetting underfill component may further include a compound, reaction products of which are controllably degradable when exposed to appropriate conditions. For example, underfill component 90 may include, at least in part, a reworkable composition, which is controllably degradable, thus providing the integrated circuit chip 60/substrate 70 interface with a point of detachment, if, desired. As such, circuit assembly 50 includes a structure such that integrated circuit chip 60 can be removed from substrate 70, for example, in the event of failure of the chip. Thus, circuit assembly 50 is provided with a point of detachment which allows for repair, replacement, recovery, and/or recycling of operative components from assemblies that have become, at least in part, inoperative.

In such an embodiment, underfill component 90 may include any composition which is curable to form a cured composition, thus providing an adhesive for adhering or affixing chip die 62 to substrate 70, and which is capable of being reworked under appropriate conditions, such as by softening or degradation, with a loss of adherence so as to release chip die 62 from substrate 70. For example, underfill component 90 desirably includes a compound having a cleavable linkage within the chemical structure thereof, such as a thermally cleavable linkage. As such, underfill component 90 is capable of softening under exposure to elevated temperature conditions, such as those in excess of the temperatures used to cure the composition, and desirably in excess of those used to reflow the solder. Such temperature exposure triggers the thermal cleavability of the thermally cleavable linkage to provide such a reworkable aspect to underfill component 90.

In such embodiments involving a reworkable composition, the thermosetting underfill component desirably includes a curable resin component, at least a portion of which includes at least one thermally cleavable linkage, a curing agent for promoting cure of the curable component, and optionally an inorganic filler component. Desirably, the curable resin component includes an epoxy or episulfide resin. As such, the thermosetting underfill component may incorporate solely epoxy or episulfide resins which provide the reworkable aspect of cured reaction products thereof, or it may incorporate such epoxy or episulfide resins which, together with a thermosetting epoxy composition, make up the thermosetting underfill component. Desirably, the thermosetting underfill component includes a reworkable epoxy or episulfide resin, a thermosetting epoxy composition, and a curing agent in such embodiments. For example, the reworkable epoxy or episulfide resin may represent from 10% to 100% of the thermosetting underfill component, more desirably from 40% to 60% of the thermosetting underfill component.

The reworkable composition of thermosetting underfill component includes any composition which is capable of thermally curing, providing adhesive and sealing properties, and which is capable of softening and degrading upon exposure to temperatures in excess of the curing temperature, particularly in excess of the solder reflow temperature. Desirably, the reworkable composition included within the thermosetting underfill component includes a compound having at least one thermally cleavable linkage selected from diepoxides including acyclic acetal groups and full and partial episulfide equivalents thereof; diepoxides including secondary carboxyl or thiocarboxyl linkages and full and partial episulfide equivalents thereof; diepoxides including tertiary carboxyl linkages and full and partial episulfide equivalents thereof; diepoxides including an aromatic moiety within the structure and full and partial episulfide equivalents thereof; compounds having at least two heteroatom-containing carbocyclic structures pending from a core structure containing at least one ether, thioether or carbonate linkage; and mixtures and combinations thereof.

For example, epoxy compounds with at least one thermally cleavable linkage useful as the reworkable composition may be chosen from those within the following formula:

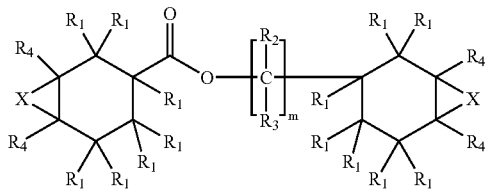

I where each $R_1$ is independently selected from hydrogen, methyl, ethyl, propyl, isopropyl, butyl, isobutyl, tert-butyl, $C_{1-4}$ alkoxy, halogen, cyano and nitro; each $R_4$ is independently selected from hydrogen, methyl, ethyl, propyl and isopropyl; $R_2$ and $R_3$ are each independently selected from hydrogen, methyl, ethyl, propyl, phenyl, tolyl and benzyl, provided that both $R_2$ and $R_3$ cannot be hydrogen, X is independently selected from O and S, and m is 0 or 1.

The reworkable compositions may also be selected from epoxy compounds including two oxycarbonyl groups, the first and second oxycarbonyl groups being separated by an aromatic moiety. Such compounds may be chosen from aromatic ester linkages and aliphatic ester linkages with the aromatic moiety being present within the network structure. Particularly desirable are tert-ester linkages incorporating an aromatic moiety.

Desirable compounds having two oxycarbonyl groups separated by an aromatic moiety include those having the following structure:

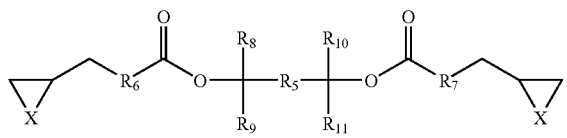

II where $R_5$ is phenylene; $R_6$ and $R_7$ are each independently selected from methylene, ethylene, propylene, or phenylene; $R_8$ and $R_9$ are each independently selected from hydrogen, methyl, ethyl, and propyl, provided that both $R_8$ and $R_9$ cannot be hydrogen; $R_{10}$ and $R_{11}$ are each independently selected from hydrogen, methyl, ethyl, and propyl; and X is independently selected from O and S. In particularly desirable compounds, $R_5$ is an ortho-substituted phenyl group, a meta-substituted phenyl group, or a para-substituted phenyl group. Additional desirable compounds include those having the following formula:

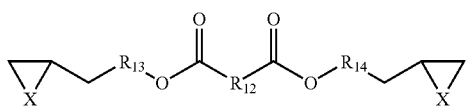

III where $R_{12}$ is phenylene, $R_{13}$ and $R_{14}$ are independently selected from secondary or tertiary aliphatic moieties, and X is independently selected from O and S.

Compositions including a cleavable compound and including a partial or complete episulfide within the compound are also useful as reworkable compositions for the present invention. For example, the curable composition may be:

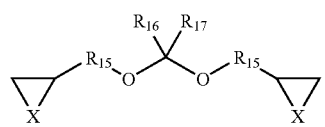

IV where each $R_{15}$ is independently selected from $C_1$–$C_{10}$ alkyl, cycloalkyl, aryl, aralkyl, and alkaryl; $R_{16}$ and $R_{17}$ are each independently selected from hydrogen, methyl, ethyl, propyl, phenyl, hydroxyphenyl, methoxyphenyl, tolyl, and benzyl; and X is independently selected from O and S. For example, the curable compound may be:

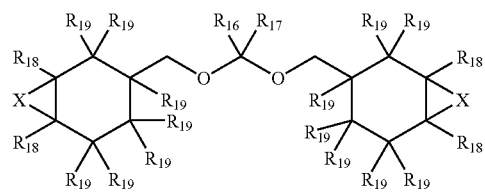

V where $R_{16}$ and $R_{17}$ are each independently selected from hydrogen, methyl, ethyl, propyl, phenyl, hydroxyphenyl, methoxyphenyl, tolyl, and benzyl; each $R_{18}$ is independently selected from hydrogen, methyl, ethyl, propyl, and isopropyl; each $R_{19}$ is independently selected from hydrogen, methyl, ethyl, propyl, isopropyl, butyl, isobutyl, t-butyl, $C_1$–$C_4$ alkoxy, halogen, cyano and nitro; and X is independently selected from O and S.

The curable compound may also be represented by the formula:

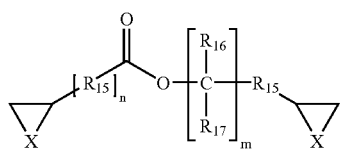

VI where each $R_{15}$ is independently selected from $C_1$–$C_{10}$ alkyl, cycloalkyl, aryl, aralkyl, and alkaryl; $R_{16}$ and $R_{17}$ are each independently selected from hydrogen, methyl, ethyl, propyl, phenyl, hydroxyphenyl, methoxyphenyl, tolyl, and benzyl; m is 0 or 1; n is 0 or 1, and X is independently selected from O and S.

Combinations of such compounds may also be used.

Other useful reworkable compositions include those having a cyclic hydrocarbon moiety including an epoxy (or oxirane) or an episulfide (or thiirane) group, as well as an aromatic ether moiety also including an oxirane or thiirane group. The cyclic hydrocarbon moiety and the aromatic ether moiety are joined to each other through a carboxyl-containing linkage or a thiocarboxyl-containing linkage.

Each moiety of the compound may independently include either an epoxy group or an episulfide group. For example, the cyclic hydrocarbon moiety of the present invention desirably includes an oxirane group, such as a cycloaliphatic epoxy moiety. Alternatively, the cyclic hydrocarbon moiety may include a thiirane group, such as a cycloaliphatic episulfide moiety. Also, the aromatic ether moiety desirably includes an oxirane group, such as an aromatic glycidyl ether moiety. Alternatively, the aromatic ether moiety may include a thiirane group, such as an aromatic thioglycidyl ether moiety.

Such useful compounds may be defined by the following formula:

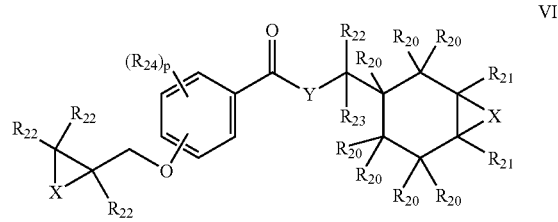

VII where $R_{20}$ is selected from hydrogen, methyl, ethyl, propyl, isopropyl, butyl, isobutyl, tert-butyl, $C_{1-4}$ alkoxy, halogen, cyano, nitro and phenyl; each $R_{21}$ is independently selected from hydrogen, methyl, ethyl, propyl, and isopropyl; $R_{22}$ and $R_{23}$ are independently selected from hydrogen, methyl, ethyl, propyl, phenyl, tolyl, and benzyl; $R_{24}$ is independently selected from hydrogen, methyl, ethyl, propyl, isopropyl, butyl, isobutyl, tert-butyl, $C_{1-4}$ alkoxy, halogen, cyano, nitro and phenyl; p is an integer from 0–4; and X and Y are independently selected from O and S.

As indicated, Y can be O or S, thus providing the structure with a carboxyl or thiocarboxyl linkage between the cyclic hydrocarbon moiety and the aromatic ether moiety. Desirably, Y is oxygen, producing a carboxyl linkage between the moieties.

Further, at least one of $R_{22}$ and $R_{23}$ may be other than hydrogen, producing a secondary linkage between the cycloaliphatic moiety and the aromatic ether moiety. More desirably, neither $R_{22}$ nor $R_{23}$ are hydrogen, producing a tertiary linkage between the cycloaliphatic moiety and the aromatic moiety.

The reworkable composition may further be a curable resin component chosen from those having at least two heteroatom-containing carbocyclic structures pending from a core structure, with the core structure containing at least one linkage selected from ether, thioether, carbonate, and combinations thereof, which linkage is capable of being reworked under appropriate conditions so as to lose its adhesiveness. For example, the curable resin may be represented by the following structure:

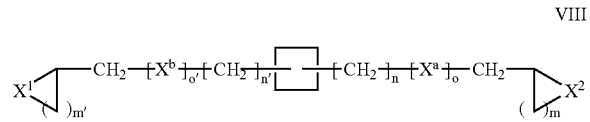

VIII

The box may represent one or more structural linkages including aromatic rings(s) or ring system(s), with or without interruption or substitution by one or more heteroatoms, examples of which are given below.

$X^1, X^2, X^a$, and $X^b$ may be the same or different and represent the heteroatoms, oxygen and sulfur. The letter designations, m and m', represent integers within the range of 1 to 3, n and n' represent integers within the range of 0 to 8, and o and o' represent integers within the range of 1 to 3. The box of the core structure of aromatic rings within the curable resin of structure VIII may be individual aromatic rings, or aromatic ring systems having multiple aromatic units joined in fused ring systems, joined in bi-aryl (such as biphenyl) or bis-aryl (such as bisphenol A or bisphenol F, or bisphenol compounds joined by a heteroatom) systems, joined in cycloaliphatic-aromatic hybrid ring systems, or joined in oligomeric (such as novalec-type) systems, examples of which include, among others, naphthalene, anthracene, phenanthracene, and fluorene.

For instance, the box may represent the structural linkage:

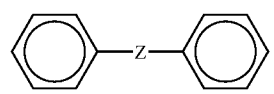

where Z may or may not be present and when present is carbon, or the heteroatom, oxygen or sulfur. Or the box may represent a phenylene group. Either of these representations may bear substitution at one or more locations on the aromatic ring(s) with functional groups ordinarily present on aromatic rings(s), such as alkyl, alkenyl, halo, nitro, carboxyl, amino, hydroxyl, thio, and the like.

For instance, particularly desirable curable resins within structure VIII include MPG, bis[4(2,3-epoxy-propylthio)phenyl]-sulfide (CAS Reg. No. 84697-35-8), available commercially from Sumitomo Seika Chemicals Co., Ltd., Osaka, Japan and XBO, xylene bisoxetane (CAS Reg. No. 142627-97-2), available commercially from UBE Industries, Ltd., Tokyo, Japan.

The reworkable composition may further be a curable resin represented by the following structure:

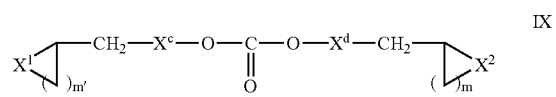

IX where $X^1$ and $X^2$ are as above; $X^c$ and $X^d$ may be the same or different, may or may not be present, and when present represent alkyl, alkenyl, aryl, and the like; and the letter designations, m and m' are as above.

The heteroatom-containing carbocyclic structures pending from the core structure may be three-, four-, or five-membered rings with the heteroatom being an oxygen and/or sulfur atom. These ring structures cross-link with one another under appropriate conditions to form reaction products of the compositions.

The carbonate linkage is degradable upon exposure to elevated temperature conditions, with or without the presence of acid. This linkage is capable of degrading to liberate carbon dioxide gas.

The temperature used to effect such degradation of compositions within the scope of the present invention may be as great as 50° C. lower than the temperatures required to degrade ordinary epoxy-based compositions used for this purpose, such as those based on bisphenol-A-type epoxy resins or bisphenol-F-type epoxy resins, which are ordinarily in the vicinity of about 300° C. or more. Moreover, the temperature used to effect such degradation should be above the reflow temperature of the solder, so as to result in reflow of the solder during such degradation. Such solder reflow temperatures are ordinarily in the vicinity of about 200° C. to 230° C.

A particularly desirable curable resin within structure IX includes CBO, carbonate bisoxetane (CAS Reg. No. 60763-95-3), available commercially from UBE Industries, Ltd., Tokyo, Japan.

The curable resin may also be an epoxy resin where at least a portion of such epoxy resin includes an epoxy resin having at least one alkylene oxide residue position adjacent at least one terminal epoxy group. The epoxy resin may be based on mono- or multi-functional aliphatic epoxies, epoxies with a cycloaliphatic ring structure or system, or epoxies with an aromatic ring structure or system, and combinations thereof.

The epoxy compounds with at least one thermally cleavable anhydride linkage may be chosen from those within the following formula:

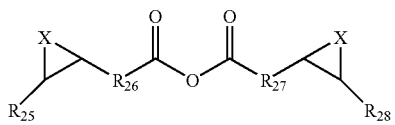

X where $R_{25}$ and $R_{28}$ are each independently selected from hydrogen, methyl, ethyl, propyl, isopropyl, butyl, isobutyl, t-butyl, $C_{1-4}$ alkoxy, halogen, cyano and nitro, and $R_{26}$ and $R_{27}$ may or may not independently be present, but when present are each independently selected from methylene, ethylene, propylenes, and butylenes, and arylenes, such as phenylenes, benzylenes, phenoxylenes, benzyoxylenes and derivatives thereof, and when $R_{26}$ and $R_{27}$ are present, $R_{25}$ and $R_{26}$ taken together, and/or $R_{27}$ and $R_{28}$ taken together, may form a cyclic or bicyclic structure, such as a carbocyclic (e.g., cyclopentyl, cyclohexyl, cycloheptyl or norbornyl) or a heterocyclic, which cyclic structures may be the same or different and may be substituted by straight chain or branched alkyl or alkenyl groups of from 1 to about 6 carbon atoms, which themselves may be substituted by halogen, hydroxyl, or an alkoxy group, such as about $C_{1-4}$ alkoxy.

The reworkable composition may also include (a) an epoxy resin component, at least a portion of which is a compound having at least one linkage selected from oxiranes, thiiranes, and combinations thereof, substituted on at least three of the substitutable positions on the oxirane and/or thiirane carbons, respectively, with an alkyl, alkenyl or aryl substituent having a carbon content of 1 to about 12 carbon atoms, with or without substitution or interruption by one or more heteroatoms or halogens, as appropriate; and (b) a curing agent component selected from anhydride compounds, amine compounds, amide compounds, imidazole compounds, and combinations thereof.

Particular examples of useful compounds can be found in International Patent Application No. PCT/US00/07452, published Sep. 28, 2000 entitled "Reworkable Thermosetting Resin Compositions", International Patent Application No. PCT/US00/11878 entitled "Reworkable Thermosetting Resin Compositions", U.S. Provisional Application No. 60/222,392 filed Aug. 2, 2000 entitled "Reworkable Thermosetting Resin Compositions", U.S. Provisional Application No. 60/232,813 filed Sep. 15, 2000 entitled "Reworkable Compositions Incorporating Episulfide Resins", U.S. Provisional Application No. 60/230,098 filed Sep. 5, 2000 entitled "Reworkable Thermosetting Resin Compositions and Compounds Useful Therein", U.S. Provisional Application No. 60/198,747 filed Apr. 21, 2000 entitled "Reworkable Thermosetting Resin Composition" and U.S. Provisional Application No. 60/193,547 filed Mar. 31, 2000 entitled "Reworkable Thermosetting Resin Composition", the disclosures of each of which are hereby expressly incorporated herein by reference.

Particularly desirable are those compositions having a rework temperature which is above the solder reflow temperature.

As discussed, FIG. 3 depicts a circuit assembly 50 in which integrated circuit chip 60 is prepared for attachment to substrate 70 for forming circuit assembly 50. As noted, the present invention is directed to an integrated circuit chip which is electrically interconnectable to a carrier substrate, such as integrated circuit chip 60 as shown. Such integrated circuit chip 60 includes solder bumps 82 including fluxing agent 85 disposed thereon, and further includes underfill component 90 as a curable thermosetting composition, capable of curing under exposure to appropriate conditions to form a fully cured thermoset underfill material in a solid form. Moreover, the present invention further provides circuit assembly 50 in an assembled form, as depicted in FIG. 4, in which chip die 62 has been mated with substrate 70, and exposed to appropriate conditions to cause fluxing agent 85 to flux the adjoining surfaces between solder bumps 82 and solder pads 88, to cause solder bumps 82 to flow for soldering, and to cause underfill component 90 to be cured into a thermoset composition in solid form. As such, chip die 62 is electrically interconnected with substrate 70 through the use of solder bumps 82. Also, chip die 62 is affixed or adhered to substrate 70 through underfill component 90 which is cured into a cured thermoset underfill compound which is substantially free of residue from fluxing agent 85, since underfill component 90 and fluxing agent 85 were provided as distinct components on discrete portions of integrated circuit chip 60, as opposed to being provided in a homogeneous fluxing adhesive composition.

Figure 5:
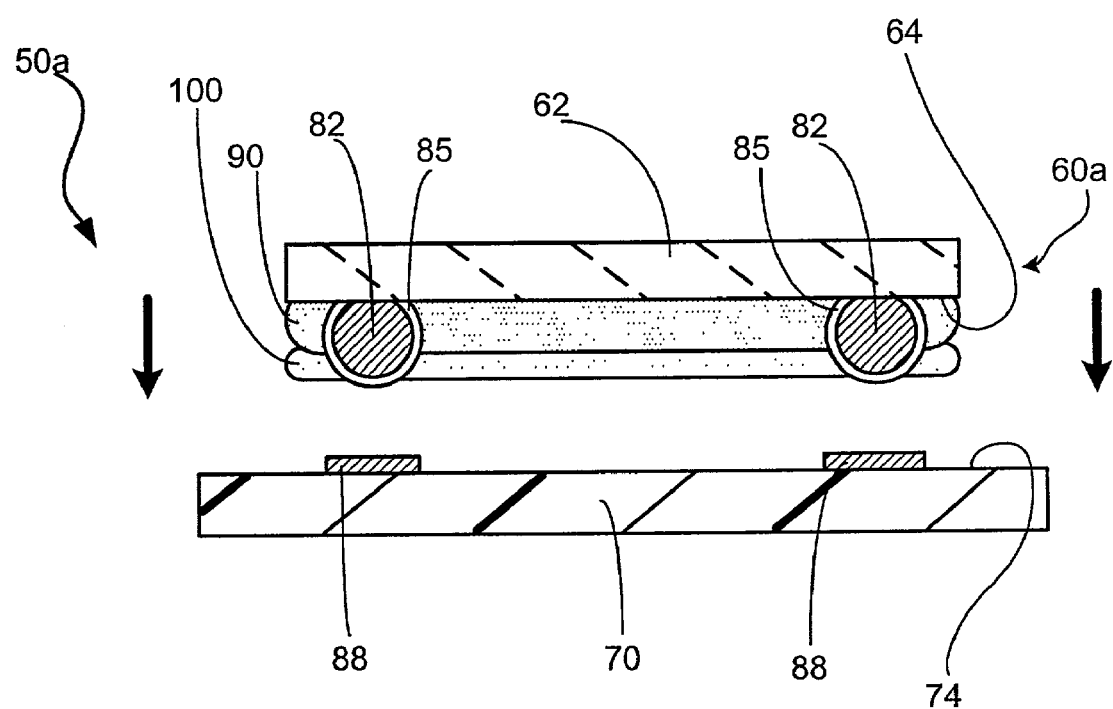
FIG. 5 is a schematic representation of a circuit assembly according to an alternate embodiment of the present invention showing a flip-chip circuit chip and a substrate prior to assembly.
Figure 6:
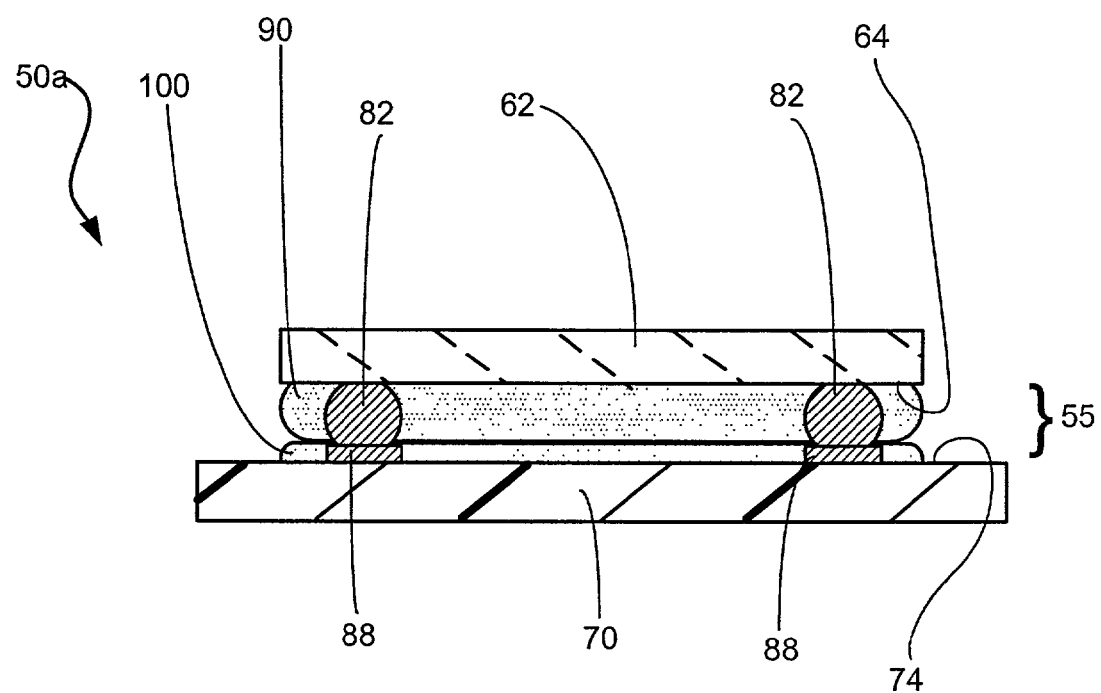
FIG. 6 is a schematic representation of the circuit assembly of FIG. 5 after assembly.

FIGS. 5 and 6 depict a further embodiment of the invention, in which circuit assembly 50a includes integrated circuit chip 60a having chip die 62 including solder bumps 82 thereon with fluxing agent 85 disposed on a surface thereof, as set forth in the embodiment described above with reference to FIGS. 3 and 4. In the embodiment of FIGS. 5 and 6, however, integrated circuit chip 62a includes underfill component 90 as a first underfill component, and further includes a second underfill component 100. As such, gap 55 formed between the chip die 62 and the substrate 70 around solder bumps 82 is encapsulated with two separate compositions which cure to provide an underfill encapsulant within gap 55 including both underfill component 90 and second underfill component 100.

Second underfill component 100 is a curable composition which also provides high adhesive strength and low thermal expansion. In a similar manner as underfill component 90, thermosetting resin compositions are particularly useful as second underfill component 100. Accordingly, second underfill component 100 may be any composition as described herein with respect to underfill component 90. For example, second underfill component 100 desirably includes, broadly, (a) a curable resin component; (b) an optional inorganic filler component; and (c) a curing agent component including an anhydride component, a nitrogen-containing component, such as an amine compound, an amide compound, and/or an imidazole compound, and/or combinations thereof, as set forth above with respect to underfill component 90.

Second underfill component 100 may be the same composition as underfill component 90 and provided as a distinct layer to the circuit assembly 50a. Alternatively, second underfill component 100 may be a thermosetting resin composition which is different from the composition of underfill component 90. As such, circuit assembly 50a, including underfill component 90 and second underfill component 100, may include any combination of thermosetting resin compositions as set forth above. Underfill component 90 and second underfill component 100 are desirably selected to include properties corresponding to the surface to which they are adhered in the circuit assembly 50a. For example, as shown in FIG. 6, underfill component 90 is adhered to chip die 62. As such, underfill component 90 may be a thermosetting composition which, when cured, has a coefficient of thermal expansion which is compatible with chip die 62. In a similar manner, second underfill component 100 is adhered between underfill component 90 and substrate 70. Accordingly, second underfill component 100 may be a thermosetting composition which, when cured, has a coefficient of thermal expansion which is compatible with the substrate 70.

In desirable assemblies, at least one of underfill component 90 and second underfill component 100 includes a reworkable composition, as described above. For example, underfill component 90 may be provided as an underfill material, while second underfill component 100 may provided as a separate and discrete component of a reworkable composition. With both underfill component 90 and second underfill component 100 present as discrete and separate components, the strength and thermal expansion properties can be borne almost exclusively by underfill component 90. As such, second underfill component 100 can be employed solely for its reworkable properties and can, therefore, exist as only a thin layer or a small part of the overall underfill without the need for additional filler materials for added strength and expansion. Thus, a high degree of reworkability can be achieved without sacrificing strength or other physical properties, since the composition of the second underfill component 100 can be limited to components necessary to provide the reworkable aspect.

As seen in FIG. 6, circuit assembly 50a in an assembled form includes chip die 62 after it has been mated with substrate 70, and exposed to appropriate conditions to cause fluxing agent 85 to flux the adjoining surfaces between solder bumps 82 and solder pads 88, to cause solder bumps 82 to flow for soldering, and to cause underfill component 90 and second underfill component 100 to cure into a thermoset composite in solid form. Thus, chip die 62 is electrically interconnected with substrate 70 through the use of solder bumps 82, and is affixed or adhered to substrate 70 through the cured thermoset composite provided through underfill component 90 and second underfill component 100 which are substantially free of residue from fluxing agent 85. Moreover, underfill component 90 may represent a first dielectric layer which has a coefficient of thermal expansion which is compatible with chip die 62, while second underfill component 100 may represent a second dielectric layer which has a coefficient of thermal expansion which is compatible with substrate 70.

Integrated circuit chip 60 may be assembled through application of the appropriate layers to form the various components, thus forming an integrated circuit chip having electrical contacts and one or more underfill components pre-assembled thereon, which can be effectively soldered and affixed to a circuit board substrate. Such assembly may be accomplished by providing chip die 62 with electrical contacts including solder bumps 82 which are flowable. Solder bumps 82 can be applied through any known method for solder bump application. Fluxing agent 85 is applied over at least a portion of solder bumps 82 which are provided for electrical interconnection with substrate 70, and may be applied over the entire surface of solder bumps 82. Such application may be accomplished by dissolving the fluxing agent in a suitable solvent system for printing over solder bumps 82, for example by screen printing, stencil printing, jet printing, pad printing, or offset printing, as noted above. After application of the solution of fluxing agent 85, the chip die 62 is b-staged by heating in an oven at a temperature from about 40°–150° C. for a time period of about 5–6 hours, desirably at a temperature from about 80°–100° C. for a time period of about 1–3 hours. Such heating results in drying of the fluxing agent 85 on solder bumps 82 by driving off the solvent from the solution of the fluxing agent as applied, leaving behind the fluxing agent in a tackified film having a desirable thickness of about 0.25–2.0 mils, more desirably about 0.5 to about 1 mil.

A curable thermosetting composition representing underfill component 90 is thereafter dispensed in a flowable form on chip die 62 around solder bumps 82. For example, the curable thermosetting composition as described above may be printed onto chip die 62 at a predetermined area distinct from fluxing agent 85. As with printing of fluxing agent 85 onto solder bumps 82, such printing of the curable thermosetting composition onto chip die 62 may be accomplished in any known manner, for example, by stencil printing, jet printing, pad printing, or offset printing. Desirably, a stencil printing process is performed in which the areas of the solder bumps 82 are excluded from the printing. As such, the curable thermosetting composition representing underfill component 90 is printed over the entire surface of chip die 62 except for the solder bumps 82.

After dispensing the curable thermosetting composition, the chip die 62 is again b-staged in a drying oven in a similar manner and under similar conditions as with drying of the fluxing agent 85. For example, the chip die 62 having the curable thermosetting composition dispensed thereon in a flowable form is desirably dried at a temperature from about 60°–100° C. for a time period of about 1–3 hours. Such heating results in drying of the curable thermosetting composition on chip die 62 by driving off the solvent, thereby reducing the flowability of the composition, leaving underfill component 90 on the chip die 62 as a curable thermosetting solid residue compound in a tackified form, at a thickness of about 1 to about 10 mils, more desirably about 3 to about 4 mils. Integrated circuit chip 60 is thereby provided for attachment to substrate 70.

In embodiments including a second underfill component 100, a second curable thermosetting composition may then be dispensed in a flowable form on underfill component 90 at a predetermined area distinct from fluxing agent 85, such as by printing over underfill component 90 in a similar manner as with underfill component 90. After dispensing the second curable thermosetting composition, the chip die 62 coated as such is again b-staged by drying in an oven in a similar manner and under similar conditions as with drying of the fluxing agent 85 and underfill component 90 as described above. As with underfill component 90, such heating results in drying of the second curable thermosetting composition on bulk underfill component 90 by driving off the solvent, thereby reducing the flowability of the composition, leaving second underfill component 100 on underfill component 90 as a second curable thermosetting solid residue compound in a tackified form, having a thickness of about 0.5 to about 5 mils, more desirably about 1 to about 2 mils.

As shown in FIGS. 3 and 5, a portion of solder bumps 82, including fluxing agent 85 coated thereover, is exposed from underfill component 90 and, when included, from second underfill component 100. This is preferably achieved by direct printing of the underfill component 90 and the second underfill component 100 at predetermined areas around the solder bumps 82. As such, solder bumps 82 protrude beyond the underfill materials. In an alternate embodiment, solder bumps 82 may be covered by the underfill component 90 and/or the second underfill component 100 during printing, after which the portion of the underfill component 90 and/or the second underfill component 100 covering solder bumps 82 is ground away, melted away, shaved off, or otherwise removed to expose the solder bumps prior to attachment to the substrate. In procedures in which the underfill component 90 and/or the second underfill component 100 include a reworkable composition, any melting away of the underfill from solder bumps 82 should occur prior to the b-stage drying of the appropriate layer including the reworkable composition, while solvent is still present within the reworkable composition.

Figure 1:
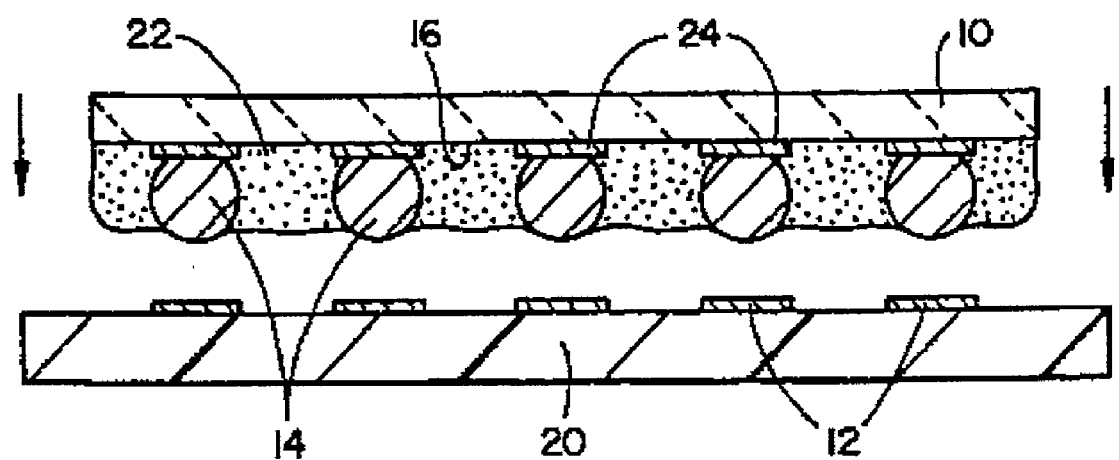
FIGS. 1 and 2 are schematic representations of underfilled flip-chip structures as shown in U.S. Pat. No. 6,121,689.
Figure 2:
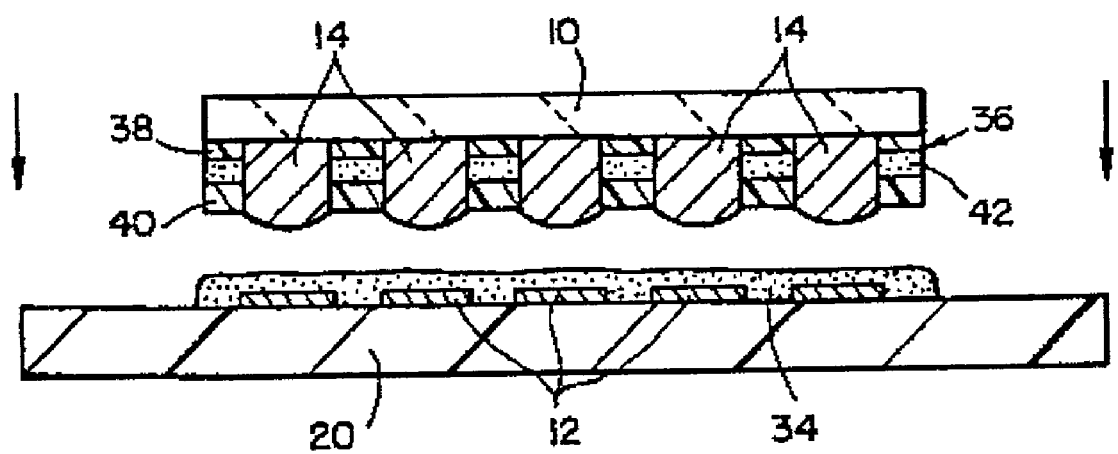

To assemble circuit assembly 50, the integrated circuit chip 60 is mated with the substrate 70 to form a mated assembly, with chip die 62 positioned so that solder bumps 82 are facing substrate 70 and aligned with the solder pads 88 of substrate 70, as depicted in FIG. 2. Integrated circuit chip 60, including chip die 62 having solder bumps 82 and underfill component 90, is moved into intimate contact with the substrate 70, such that solder bumps 82 with fluxing agent 85 coated thereon are in contacting relation with solder pads 88. The assembly is then exposed to temperature conditions sufficient to promote electrical interconnection between integrated circuit chip 60 and substrate 70, for example, by heating to a temperature capable of causing reflow of the solder, using any known heating and reflow techniques. Such heating causes fluxing agent 85 to become activated, reducing the oxides on the solder bumps 82 and the solder pads 88, and permitting alloying of the solder bumps 82 to the solder pads 88. During the heating in this reflow process, underfill component 90 is cured to a solid form. Thus, reflow of solder bumps 82 and curing of underfill component 90 and reworkable component 100 occur within the same processing procedure. As such, circuit assembly 50 is formed with the circuitry encapsulated by underfill component 90 as depicted in FIG. 4, with a continuous seal provided around the periphery of the assembly to protect the surface from environmental contamination. A semiconductor device is thus provided for various electronic applications.

Circuit assembly 50a of FIG. 6 is assembled in a similar manner, with integrated circuit chip 60a provided for attachment to substrate 70. In such an embodiment, curing of underfill component 90 and second underfill component 100 occur within the same processing procedure.

The solder reflow profile may be composed of several zones, where a temperature is reached or maintained for a set time period, or temperature increases occur over a set time period. For example, such zones may be referred to as a pre-heating zone, a soaking zone and a reflow zone. In the pre-heating zone, the mated assembly is gradually heated to the soaking zone temperature. The heating gradation in the pre-heating zone may progress through the temperature range of 30° C. to 130° C. in a period of time of up to 60 seconds. In the soaking zone, the mated assembly is allowed to thermally equilibrate so that the thermal expansions of the various components may occur and temperature adjustments can occur. During initial heating in the soaking zone, the temperature is increased above a temperature at which the fluxing agent is activated to clean the metal surfaces, for allowing the solder to eventually make secure electrical interconnection when exposed to elevated temperatures reached during the reflow zone. The heating gradation in the soaking zone may progress through the temperature range of 150° C. to slightly greater than 180° C., such as 183° C., from a period of time of 60 to 175 seconds from initiation. In the pre-heating and soaking zones, it is desirable for the underfill composition to remain ungelled.

In the reflow zone, the solder melts, thereby flowing and forming the electrical connection. The underfill composition should gel after the solder has flowed and forms the electrical connection; otherwise, the component present can shift, thereby causing an electrical disconnect. The heating gradation in the reflow zone may progress through the temperature range of slightly greater than 180° C., such as about 183° C., to about 220° C.±10° C., from a period of 175 to 205–265 seconds from initiation. It is desirable for the underfill composition to cure completely after the solder has flowed to form the electrical connection. Curing of the underfill composition establishes an electrical interconnection while encapsulating the semiconductor device onto the substrate.

As noted above, embodiments including a reworkable composition within underfill component 90 and/or second underfill component 100 provides circuit assembly 50 with a cleavable linkage which allows for repair, replacement, recovery and/or recycling of operative components from assemblies that have become at least in part inoperative. Removal of integrated circuit chip 60 from substrate 70 can therefore be accomplished by heating the thermoset underfill component including the reworkable composition to a temperature above its cure temperature, causing the composition to thermally degrade. For example, the area around the integrated circuit chip 6, which is to be removed is heated to a temperature above the cure temperature of the resin composition for a sufficient time period to allow the resin composition to soften. Although no particular limitation is placed on the way in which heating occurs, localized heating is particularly desirable, such as the application of hot air to the failure site by a heating gun. Such heating results in melting of the solder of solder bumps 82, and softening of the resin of the reworkable composition by partial decomposition, thereby causing a reduction in bond strength. The integrated circuit chip 60 can then be removed from the substrate 70, such as with tweezers or a pair of pliers.

After the integrated circuit chip 60 is removed from substrate 70, a residue of the cured reaction product of the underfill composition and a residue of the solder are left on the circuit board substrate 70. The residue of the cured product of the underfill composition can be removed, for example, by scraping it off after the residue has been softened by heating it to a predetermined temperature. The residue of the solder can be removed, for example, by use of a solder-absorbing braided wire.

A new integrated circuit chip can then be mounted onto the circuit board substrate, in the manner as described above.

By providing the fluxing agent as a separate and distinct component from the adhesive underfill materials, the fluxing agent can be used at a high concentration, such as a highly concentrated organic acid. Since it is provided as a separate, discrete component, the fluxing agent can act effectively for its purpose as a fluxing agent for providing fluxing action for the soldering operation, and will not deleteriously affect the strength and adhesion properties of the underfill material, as is oftentimes the case in homogeneous fluxing underfill adhesives which incorporate the fluxing agent and underfill material in a single composition.

Moreover, in embodiments in which one of the underfill compositions includes a reworkable composition as a discrete and separate component or layer, high strength resins can be used in combination with low expansion fillers for the bulk underfill component. Thus, the bulk underfill layer provides excellent physical strength with low overall thermal expansion, without any deleterious effects on the fluxing activity of the fluxing agent or any sacrifice in performance due to incorporation of a reworkable composition therein. Also, since the reworkable component is contained in only a thin layer directly at the surface of attachment of the circuit chip to the substrate, a high degree of reworkability can be achieved directly at the bonding point without sacrificing strength and fluxing activity, as may occur in assemblies which incorporate reworkable resin compositions into the bulk adhesive underfill.

Figure 7:
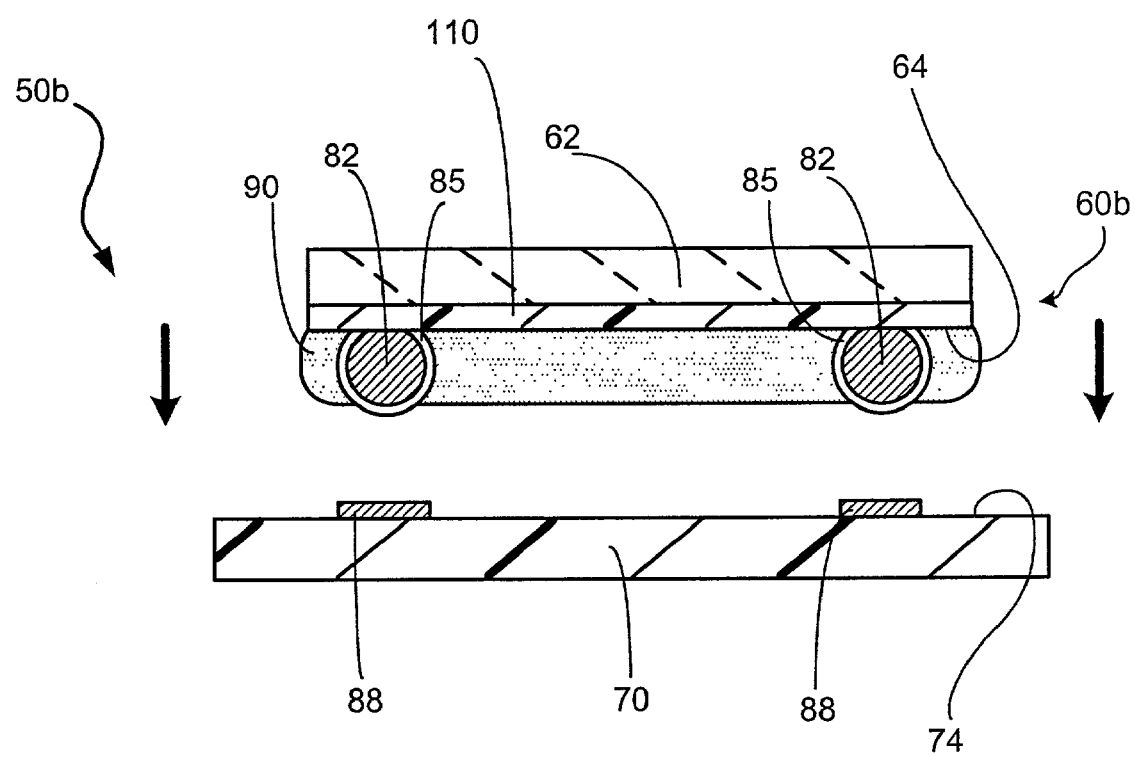
FIG. 7 is a schematic representation of a circuit assembly in a further embodiment of the present invention.
Figure 8:
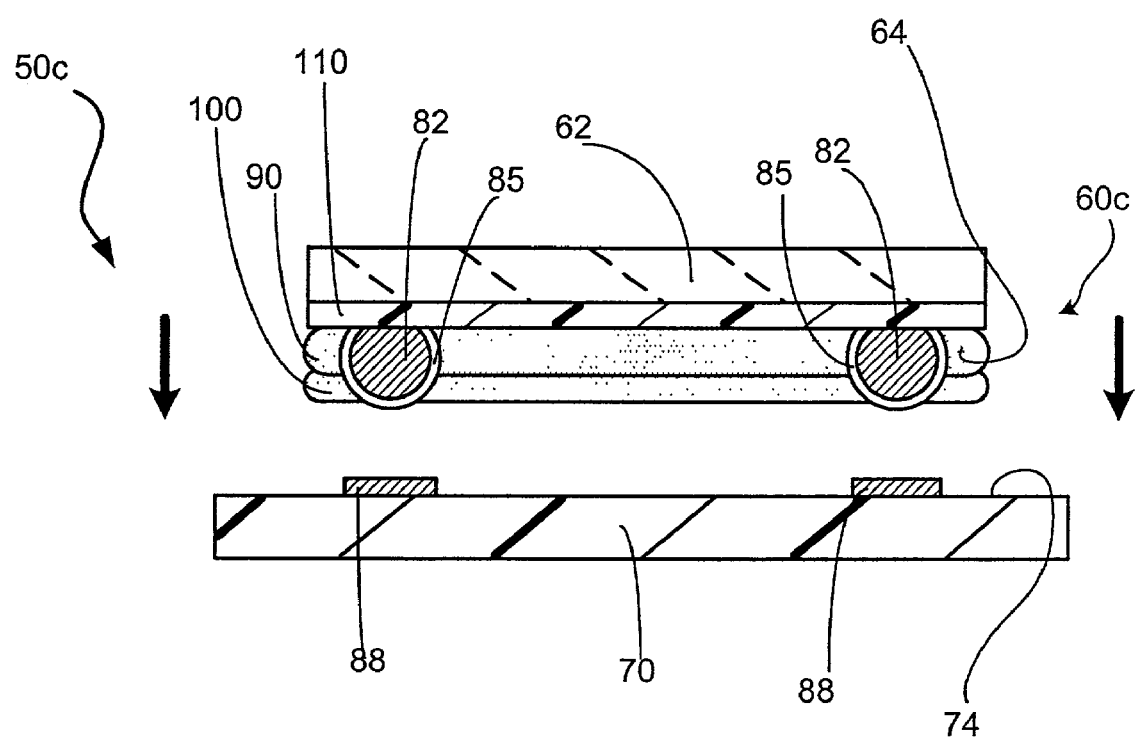
FIG. 8 is a schematic representation of a circuit assembly in a further embodiment of the present invention.

In a further embodiment shown in FIG. 7, integrated circuit chip 60b is provided with solder bumps 82 pre-assembled thereon and pre-coated with a multi-layer structure prior to assembly to the substrate 70. The multi-layer structure includes separate layers, each of which perform distinct functions. For example, chip die 62 may include a first layer which is a stress absorbing layer 110, attached directly to surface 64 of chip die 62. Underfill component 90 is provided thereover as a separate layer, in a manner and arrangement as discussed above. In such an arrangement, the use of the additional stress absorbing layer 110 provides for a circuit assembly 50b having improved strength. In a similar manner, such a stress absorbing layer 110 can be provided in an embodiment including both an underfill component 90 and a second underfll component 100, providing an integrated circuit chip 60c, as shown in FIG. 8. In such an embodiment, underfill component 90 and second underfill component 100 are provided over stress absorbing layer 110 as separate layers, in a manner and arrangement as discussed above, thereby providing a circuit assembly 50c having improved strength.

Figure 9:
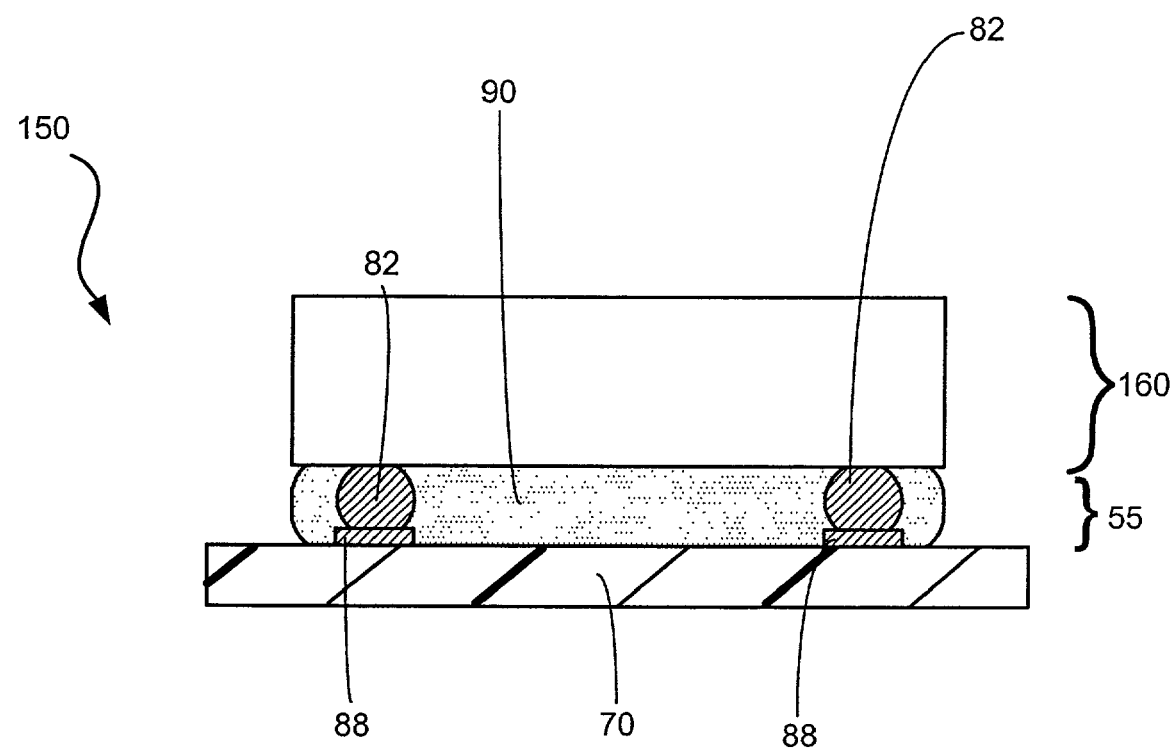
FIG. 9 is a schematic representation of a circuit assembly including a chip scale package assembled to a substrate in a further embodiment of the present invention.
Figure 10:
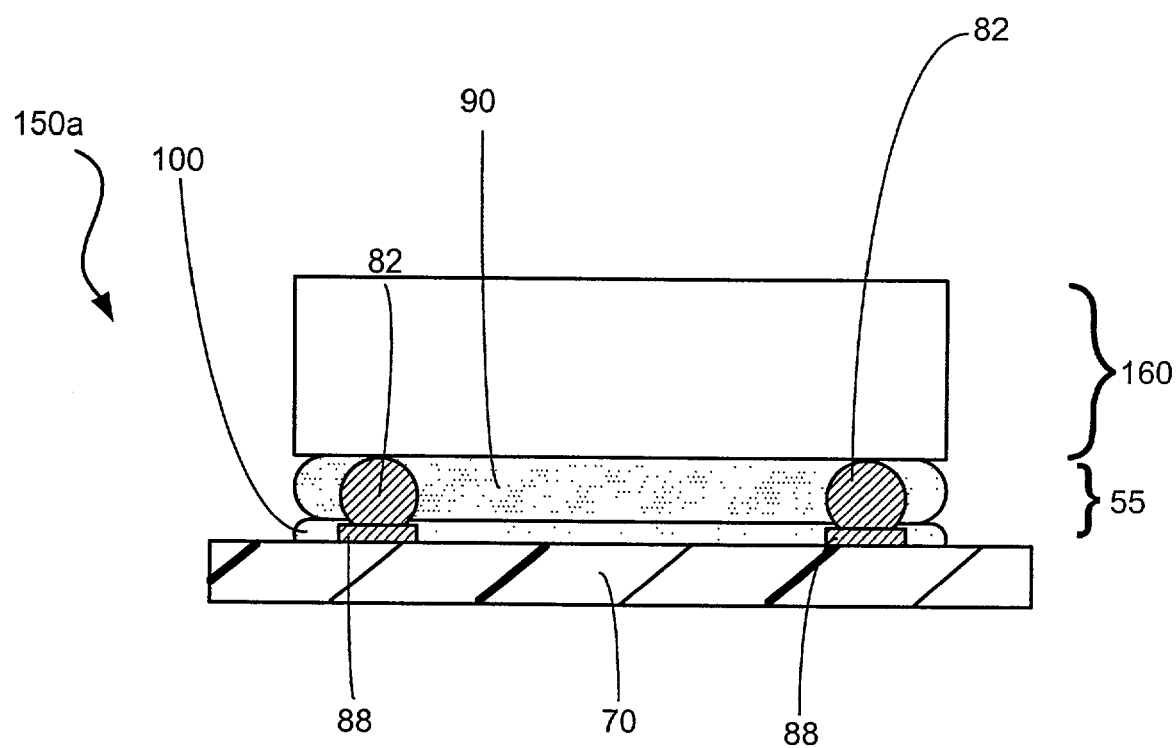
FIG. 10 is a schematic representation of a circuit assembly including a chip scale package assembled to a substrate according to a further embodiment of the present invention.

It is noted that chip die 62 as discussed herein may be provided as an individual chip die, or may be provided as a chip scale package. Accordingly, in yet a further embodiment shown in FIG. 9, a circuit assembly 150 is provided including a chip scale package 160. Chip scale packages are known in the art for use in electrical connections of circuits with circuit board substrates. In the present embodiment, circuit assembly 150 includes a structure similar to that shown in the embodiment depicted in FIG. 4, except that chip die 62 is replaced with chip scale package 160. For example, circuit assembly 150 includes a circuit board substrate 70 including solder pads 88 thereon. Substrate 70, however, is not attached directly to an integrated circuit chip, as in the embodiment depicted in FIG. 4, but is instead attached to chip scale package 160, which may include, for example, a chip die attached to a separate carrier substrate or an interposer layer, as is known in the art. In such an embodiment, solder bumps 82 may be provided on such a separate carrier substrate or on the interposer layer, in a similar manner as set forth with respect to circuit chip 60 in the previous description. Moreover, chip scale package 160 is attached to substrate 70 in a similar manner as with the previous description, through fluxing agent 85 coated over solder bumps 82, and underfill component 90. Such a chip scale package 160 can also be assembled to substrate 70 through a first underfill component and a second underfill component, as shown in circuit assembly 150a in FIG. 10.

The present invention will be more readily appreciated with reference to the examples which follow.

EXAMPLES

Example I—Fluxing Agent

A fluxing agent was prepared in accordance with the present invention including the following components:

TABLE I

| COMPONENT | WEIGHT PERCENT |
|---|---|
| Fluxing agent (diacid)[1] | 50 |
| Epoxy resin[2] | 25 |
| Carrier solvent (ethyl ethoxypropionate)[3] | 25 |

[1]Commercially available as DIACID 1550 from Westvac Oleo Chemicals.
[2]Commercially available as DER 661 from Dow Chemical Co.
[3]Commercially available as EEP from Eastman.

The fluxing agent prepared including the above components exhibits excellent storage stability, with a shelf life of ≧4 months. Further, upon b-staging, the fluxing agent dries to a tacky solid material. During use in solder reflow techniques, the fluxing agent exhibits excellent fluxing activity.

Example II—Bulk Underfill Composition

A bulk underfill composition according to the present invention may be prepared including the components as set forth in Table II-A:

TABLE II-A

| COMPONENT | WEIGHT PERCENT |
|---|---|
| Epoxy resin (bisphenol A type)[1] | 5–25 |
| Epoxy resin (novalec type)[2] | 5–25 |
| Curing agent (dicyandiamide)[3] | 0.1–10 |
| Pigment (carbon black) | 0–1 |
| Structural filler (spherical silica)[4] | 0–80 |
| Surfactant[5] | 0–2 |
| Adhesion promoter (silane)[6] | 0–5 |
| Viscosity/thixotropy modifier (fused silica)[7] | 0–5 |
| Carrier solvent (ethyl ethoxy propionate)[8] | 2–40 |

[1]Commercially available as EPON 1001 from Shell Chemical Co.
[2]Commercially available as XD-1000-2L from Nippon Kayaku.
[3]Commercially available as CG 1400 from Air Products.
[4]Commercially available as ML-801 from Tokuyama Corp.
[5]Commercially available as BYK-555 from BYK-Chemie, Wallingford, CT.
[6]Commercially available as A-1100 from Witco Corp.
[7]Commercially available as AEROSIL R812S from Degussa.
[8]Commercially available as EEP from Eastman.

A specific formulation was prepared according to the following components as set forth in Table II-B:

TABLE II-B

| COMPONENT | WEIGHT PERCENT |
|---|---|
| Epoxy resin (bisphenol A type)[1] | 12.44 |
| Epoxy resin (novalec type)[2] | 12.44 |
| Curing agent (dicyandiamide)[3] | 1.49 |
| Pigment (carbon black) | 0.1 |

TABLE II-B-continued

| COMPONENT | WEIGHT PERCENT |
|---|---|
| Structural filler (spherical silica)[4] | 62.05 |
| Surfactant[5] | 0.1 |
| Adhesion promoter (silane)[6] | 0.4 |
| Viscosity/thixotropy modifier (fused silica)[7] | 1.47 |
| Carrier solvent (ethyl ethoxy propionate)[8] | 9.51 |

[1]Commercially available as EPON 1001 from Shell Chemical Co.
[2]Commercially available as XD-1000-2L from Nippon Kayaku.
[3]Commercially available as CG 1400 from Air Products.
[4]Commercially available as ML-801 from Tokuyama Corp.
[5]Commercially available as BYK-555 from BYK-Chemie, Wallingford, CT.
[6]Commercially available as A-1100 from Witco Corp.
[7]Commercially available as AEROSIL R812S from Degussa.
[8]Commercially available as EEP from Eastman.

The bulk underfill composition prepared including the above components exhibits adhesion characteristics, particularly when used in connection with multilayered electronic assemblies of the present invention. In solder reflow techniques, the bulk underfill composition cures to provide an excellent stress reinforcement.

Example III—Reworkable Composition

Six epoxy resin compositions were prepared as follows:

TABLE III-A

| | Ratio of epoxy resin components | | | | | |
|---|---|---|---|---|---|---|
| Epoxy resin component | Epoxy A | Epoxy B | Epoxy C | Epoxy D | Epoxy E | Epoxy F |
| Bisphenol A-type epoxy[1] | 1 | 2 | 4 | 2 | 2 | 0 |
| Novalec type epoxy[2] | 1 | 2 | 2 | 4 | 0 | 2 |
| Reworkable epoxy[3] | 1 | 1 | 3 | 3 | 1 | 1 |

[1]Commercially available as EPON 1001 F from Shell Chemical Co.
[2]Commercially available as XD-100-2L from Nippon Kayaku.
[3]Reworkable epoxy composition based on one or more epoxies having thermally cleavable linkages.

Reworkable compositions can be prepared including each of these Epoxy Resins A–F, having the following components:

TABLE III-B

| COMPONENT | WEIGHT PERCENT |
|---|---|
| Epoxy resin A–F from Table III | 10–50 |
| Curing agent (dicyandiamide)[1] | 0.1–10 |
| Structural filler (spherical silica)[2] | 0–80 |
| Surfactant[3] | 0–2 |
| Adhesion promoter (silane)[4] | 0–5 |
| Viscosity/thixotropy modifier (fused silica)[5] | 0–5 |
| Carrier solvent (ethyl ethoxy propionate)[6] | 2–40 |

[1]Commercially available as CG 1400 from Air Products Corp.
[2]Commercially available as ML-801 from Tokuyama.
[3]Commercially available as BYK-555 from BYK Corp.
[4]Commercially available as A-1100 from Witco Corp.
[5]Commercially available as AEROSIL R812S from Degussa.
[6]Commercially available as EEP from Eastman.

Six specific reworkable compositions were prepared from the six Epoxy Resins A–F as shown in Table III-A to produce Compositions A–F, including the following components:

TABLE III-C

| COMPONENT | WEIGHT PERCENT |
|---|---|
| Epoxy resin A–F from Table III | 24.88 |
| Curing agent (dicyandiamide)[1] | 1.49 |
| Structural filler (spherical silica)[2] | 62.05 |
| Surfactant[3] | 0.1 |
| Adhesion promoter (silane)[4] | 0.4 |
| Viscosity/thixotropy modifier (fused silica)[5] | 1.47 |
| Carrier solvent (ethyl ethoxy propionate)[6] | 9.61 |

[1]Commercially available as CG 1400 from Air Products Corp.
[2]Commercially available as ML-801 from Tokuyama.
[3]Commercially available as BYK-555 from BYK Corp.
[4]Commercially available as A-1100 from Witco Corp.
[5]Commercially available as AEROSIL R812S from Degussa.
[6]Commercially available as EEP from Eastman.

The bulk underfill compositions prepared including the above components exhibit excellent properties for use in connection with multilayered electronic assemblies of the present invention. In solder reflow techniques, the bulk underfill compositions cure to provide excellent adhesion to substrate surfaces. Upon heating of the compositions to a temperature above the solder reflow temperature and above the cure temperature, such as about 270° C., the reworkable compositions soften and degrade, thereby providing reworkability characteristics appropriate for use in multilayered electronic assemblies.

Example IV

Each of Compositions A–F from Example III were evaluated for adhesion performance after curing thereof. In particular, six separate test die were mounted to fiberglass circuit board substrates with a small amount of each of Compositions A–F applied as an adhesive. Each substrate was then heated by subjecting it to a maximum reflow temperature of 230° C., resulting in curing of Compositions A–F during such heating. After such curing, die shear strength of each the compositions was tested by shearing off the test die on a Dage-4000 shear test instrument. The results of this testing are shown in Table IV:

TABLE IV

| COMPOSITION | Kg force/square mm | psi |
|---|---|---|
| A | 3.3 | 4634.9 |
| B | NT* | NT* |
| C | 1.9 | 2704.5 |

TABLE IV-continued

| COMPOSITION | Kg force/square mm | psi |
|---|---|---|
| D | 3.3 | 4633.1 |
| E | 1.0 | 1455.3 |
| F | 2.9 | 4078.6 |

*Not Tested.

As is apparent from the die shear strengths shown in Table IV, each of the Compositions A–F prepared as reworkable components in accordance with the present invention demonstrate acceptable strengths for substrate adhesion, with specific formulations achieving excellent die shear strengths after curing.

Example V

In Example V, each of Compositions A–F were evaluated to determine cleanability of the reworkable compositions.

Each of reworkable compositions A–F were stencil printed onto a fiberglass circuit board substrate and b-staged to achieve dryness at 70° C. for a period of 2 hours. After curing each of Compositions A–F, each circuit chip was subjected to a rework temperature of 270° C. At such temperature, each of Compositions A–F softened allowing for removal of the circuit chip from the circuit board substrate. Each substrate was subjected to mechanical brushing of the surface in order to remove the residue remaining of the reworkable composition. Table V demonstrates the cleaning time after temperature exposure for periods of one and three minutes for each of Compositions A–F:

TABLE V

| COMPOSITION | EXPOSURE AT 270° C. (minutes) | CLEANING TIME (minutes) |
|---|---|---|
| A | 1 | 3–3.5 |
| A | 3 | 3–3.5 |
| B | 1 | 4.5 |
| B | 3 | 5.0 |
| C | 1 | 3–4.5 |
| C | 3 | 2.0 |
| D | 1 | 4.5 |
| D | 3 | 2.0–5.0 |
| E | 1 | 2.5–3.0 |
| E | 3 | 3.5 |
| F | 1 | 3.5–5.0 |
| F | 3 | 3.5–4.0 |

As can be seen from the results shown in Table V, each of Compositions A–F demonstrates excellent cleanability after rework of the composition.

Example VI

Example VI demonstrates adhesion of reworkable compositions in accordance with the present invention after multiple high temperature reflow cycles.

Composition A from Example III above was applied to a substrate and b-staged for drying. The substrate including Composition A thereon was then subjected to multiple reflow cycles with a peak reflow temperature of 230° C. for a period of two minutes during each reflow cycle. After one reflow cycle, Composition A demonstrated 84.4 percent residual adhesion to the substrate. After a second reflow cycle, Composition A demonstrated 96.1 percent residual adhesion. After a third reflow cycle, Composition A demonstrated slightly reduced adhesion at 92.9 percent residual adhesion. Even after six reflow cycles, Composition A demonstrated 88.6 percent residual adhesion to the substrate. Such results demonstrate the excellent adhesion demonstrated by the compositions used to assemble the inventive integrated circuit chips and structures assembled therewith.

Example VII

A fluxing agent prepared in accordance with the formulation of Example I may be applied to solder bumps on circuit chips constructed of silicon by stencil printing. The fluxing agent can b-staged for drying of the fluxing agent. A bulk underfill composition according to Example II may then be stencil printed on the circuit chips around the solder bumps including the fluxing agent coated thereon. The chips are again b-staged to dry the bulk underfill component in a similar manner as with the fluxing agent. Each of reworkable Compositions A–F can then be stencil printed onto individual circuit chips over the bulk underfill component around the solder bumps. Again, b-stage drying of each of the circuit chips to dry the reworkable component may be accomplished in a similar manner as with the fluxing agent and the bulk underfill component.

After such application, each chip can be applied to a substrate, and solder reflowed at a temperature of 230° C. for a period of about 2 minutes, resulting in reflowing of the solder and curing of the bulk underfill composition and the reworkable composition.

Circuit assemblies produced in such a manner provide excellent electrical connection between the chip and the circuit board. Additionally, as observed in earlier examples, excellent adhesion of the chip to the circuit board can be achieved. Further, reworkability of the chip can be accomplished by subjecting the assembly to rework temperatures of about 270° C. Upon such reworking, the chips can be readily removed, with little mechanical brushing required to remove residue from the circuit board substrate surface.

The invention being thus described, it will be evident to those skilled in the art that the same may be varied in many ways. Such variations are not to be regarded as a departure from the spirit and scope of the invention and all such modifications are intended to be included within the scope of the claims.

What is claimed is:

1. An integrated circuit chip electrically interconnectable with a carrier substrate comprising:
   a) a chip die having electrical contacts arranged on a surface thereof for providing electrical interconnection with electronic circuitry on a surface of the carrier substrate, said electrical contacts being flowable upon heating;
   b) a fluxing agent disposed on a surface of said electrical contacts at a location capable of providing effective fluxing activity to said electrical contacts of said chip die and said electronic circuitry of the carrier substrate when said chip die is mated with the carrier substrate;
   c) a first thermosetting underfill composition dispensed in a flowable form over said chip die about said electrical contacts and treated so as to render said first curable thermosetting underfill composition non-flowable, said first thermosetting underfill composition being distinct from said fluxing agent; and
   d) a second thermosetting underfill composition dispensed in a flowable form over said first thermosetting underfill composition about said electrical contacts and treated so as to render said second curable thermosetting underfill composition non-flowable, said second thermosetting underfill composition being distinct from said first thermosetting underfill composition and said fluxing agent, wherein upon mating said chip die with said carrier substrate to form a mated assembly and upon heating said mated assembly to a temperature sufficient to render said electrical contacts flowable, said electrical contacts flow to provide electrical interconnection between said chip die and said carrier substrate, and said first and second thermosetting underfill compositions are cured, thereby adhering said chip die to said carrier substrate.

2. An integrated circuit chip as in claim 1, wherein said fluxing agent is disposed over substantially the entire surface of said electrical contacts.

3. An integrated circuit chip as in claim 1, wherein at least a portion of said electrical contacts is exposed from said first and said second thermosetting compositions.

4. An integrated circuit chip as in claim 1, wherein said first and said second thermosetting compositions comprise a curable component, a curing agent for promoting cure of said curable component, and optionally, an inorganic filler component.

5. An integrated circuit chip as in claim 4, wherein said curable component comprises an epoxy resin.

6. An integrated circuit chip as in claim 5, wherein said epoxy resin is selected from the group consisting of bisphenol-A-type epoxy resin, bisphenol-F-type epoxy resin, phenol novolac-type epoxy resin, cresol novolac-type epoxy resin, polyepoxy compounds based on aromatic amines and epichlorohydrin, polyglycidyl derivatives of phenolic compounds; polyglycidyl derivatives of phenol-formaldehyde novolacs, polyglycidyl adducts of amines, aminoalcohols and polycarboxylic acids; and combinations thereof.

7. An integrated circuit chip as in claim 4, wherein said curing agent is selected from the group consisting of anhydride compounds, amine compounds, amide compounds, imidazole compounds, and combinations thereof.

8. An integrated circuit chip as in claim 4, wherein said inorganic filler component may be selected from the group consisting of materials constructed of or containing reinforcing silicas, aluminum oxide, silicon nitride, aluminum nitride, silica-coated aluminum nitride, boron nitride, and combinations thereof.

9. An integrated circuit chip as in claim 1, wherein said fluxing agent comprises an organic acid.

10. An integrated circuit chip as in claim 9, wherein said fluxing agent comprises a material selected from the group consisting of abietic acid, adipic acid, ascorbic acid, acrylic acid, citric acid, 2-furoic acid, malic acid, and polyacrylic acid.

11. An integrated circuit chip as in claim 1, wherein said fluxing agent comprises a latent organic acid.

12. An integrated circuit chip as in claim 1, wherein said fluxing agent comprises a thermally-activatable blocked organic acid.

13. An integrated circuit chip as in claim 1, wherein said fluxing agent further comprises an epoxy compound capable of drying to form a film of said fluxing agent on said electrical contacts and capable of reacting with at least one of said first or said second thermosetting underfill compositions upon curing of said first and second thermosetting underfill compositions.

14. An integrated circuit chip as in claim 1, wherein said chip die is constructed of material selected from the group consisting of silicon and germanium.

15. An integrated circuit chip as in claim 1, wherein said chip die is coated with a material selected from the group consisting of a polyimide-based material, poly-benzocyclobutane-based material, and a silicone nitride-based material.

16. An integrated circuit chip as in claim 1, wherein said carrier substrate is constructed of a material selected from the group consisting of $Al_2O_3$, silicon nitride, mullite, polyimide, glass-reinforced epoxy, acrylonitrile-butadiene-styrene, and phenolic substrates.

17. An integrated circuit chip as in claim 1, wherein said electrical contacts comprise solder bumps.

18. An integrated circuit chip as in claim 1, wherein reaction products of at least one of said first or said second thermosetting underfill compositions are controllably degradable when exposed to appropriate conditions.

19. An integrated circuit chip as in claim 18, wherein at least one of said first or said second thermosetting underfill compositions comprises a curable compound having at least one thermally cleavable linkage, a curing agent for promoting cure of said curable compound, and optionally, an inorganic filler component.

20. An integrated circuit chip as in claim 19, wherein said compound having at least one thermally cleavable linkage is selected from the group consisting of diepoxides including acyclic acetal groups and full and partial episulfide equivalents thereof; diepoxides including secondary carbonyl linkages and full and partial episulfide equivalents thereof; diepoxides including tertiary carbonyl linkages and full and partial episulfide equivalents thereof; diepoxides including an aromatic moiety within the structure and full and partial episulfide equivalents thereof; and combinations thereof.

21. An integrated circuit chip as in claim 1, wherein said first thermosetting underfill composition when cured provides a first dielectric layer in contact with said chip die and having a coefficient of thermal expansion compatible with said chip die, and said second thermosetting underfill composition when cured provides a second dielectric layer in contact with said first dielectric layer and said carrier substrate and having a coefficient of thermal expansion compatible with said carrier substrate and said first dielectric layer.

22. A integrated circuit chip as in claim 1, wherein said chip die comprises a packaged integrated circuit, and said electrical contacts are arranged on said packaged integrated circuit for providing electrical interconnection with said electronic circuitry of said carrier substrate.

23. A circuit assembly comprising the assembled product of claim 1.

24. A method for assembling an integrated circuit assembly comprising:
    a) providing an integrated circuit chip in accordance with claim 1;
    b) mating said integrated circuit chip with a carrier substrate to form a mated assembly; and
    c) exposing said mated assembly to temperature conditions sufficient to promote electrical interconnection between said integrated circuit chip and said carrier substrate and to cure said first and said second thermosetting underfill compositions, thereby adhering said integrated circuit chip to said carrier substrate.

25. A method for assembling an integrated circuit chip prior to attachment to a substrate comprising the steps of:
    a) providing a chip die having flowable electrical contacts arranged in a predetermined pattern thereon;
    b) applying a fluxing agent over at least a portion of said electrical contacts;

c) drying said fluxing agent after said applying step;

d) dispensing a curable thermosetting underfill composition in a flowable form on said chip die around said electrical contacts and rendering said curable thermosetting underfill composition to a non-flowable form, said thermosetting underfill composition being distinct from said fluxing agent; and e) dispensing a second thermosetting underfill composition in a flowable form on said thermosetting underfill composition around said electrical contacts, said second thermosetting underfill composition being distinct from said fluxing agent and said first thermosetting underfill composition.

26. A method as in claim 25, further comprising reducing the flowability of said thermosetting underfill composition and said second thermosetting composition after said dispensing step e).

27. A method as in claim 25, wherein any of said applying and said dispensing steps b), d), and e) comprise screen printing, stencil printing, jet printing, pad printing, or offset printing.

* * * * *